United States Patent
Kim

(10) Patent No.: US 11,600,694 B2
(45) Date of Patent: Mar. 7, 2023

(54) INTEGRATED CIRCUIT DEVICE INCLUDING GATE LINE

(71) Applicant: Samsung Electronics Co., Ltd., Suwon-si (KR)

(72) Inventor: Juyoun Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 16 days.

(21) Appl. No.: 17/106,971

(22) Filed: Nov. 30, 2020

(65) Prior Publication Data

US 2021/0408232 A1   Dec. 30, 2021

(30) Foreign Application Priority Data

Jun. 24, 2020   (KR) .................. 10-2020-0077166

(51) Int. Cl.
*H01L 29/06*   (2006.01)
*H01L 27/11*   (2006.01)

(52) U.S. Cl.
CPC ...... *H01L 29/0649* (2013.01); *H01L 27/1104* (2013.01); *H01L 27/1116* (2013.01)

(58) Field of Classification Search
CPC ............ H01L 29/0649; H01L 27/1104; H01L 27/1116; H01L 27/105; H01L 21/823437; H01L 21/823431; H01L 21/823468; H01L 21/823481
USPC ................................................ 257/288, 401
See application file for complete search history.

(56) References Cited

U.S. PATENT DOCUMENTS

| | | |
|---|---|---|
| 4,016,476 A | 4/1977 | Morokawa et al. |
| 4,074,351 A | 2/1978 | Boone et al. |
| 4,080,600 A | 3/1978 | Toman |
| 4,114,049 A | 9/1978 | Suzuki |
| 4,168,459 A | 9/1979 | Roesel, Jr. |
| 4,169,990 A | 10/1979 | Lerdman |
| 4,201,976 A | 5/1980 | Patel |
| 4,255,789 A | 3/1981 | Hartford et al. |
| 4,412,285 A | 10/1983 | Neches et al. |
| 4,486,739 A | 12/1984 | Franaszek et al. |
| 4,514,694 A | 4/1985 | Finger |
| 4,540,921 A | 9/1985 | Boyd, Jr. et al. |
| 4,706,133 A | 11/1987 | Giddings |
| 4,709,293 A | 11/1987 | Gershen et al. |
| 4,721,853 A | 1/1988 | Wraight |
| 4,750,036 A | 6/1988 | Martinez |
| 4,761,768 A | 8/1988 | Turner et al. |
| 4,841,925 A | 6/1989 | Ward |
| 4,860,290 A | 8/1989 | Daniels et al. |
| 4,959,812 A | 9/1990 | Momodomi et al. |
| 4,985,832 A | 1/1991 | Grondalski |
| 5,128,984 A | 7/1992 | Katz |
| 5,270,979 A | 12/1993 | Harari et al. |
| 5,342,034 A | 8/1994 | Mandel et al. |
| 5,477,165 A | 12/1995 | ElAyat et al. |

(Continued)

*Primary Examiner* — Dao H Nguyen
(74) *Attorney, Agent, or Firm* — Harness, Dickey & Pierce, P.L.C.

(57) ABSTRACT

An integrated circuit device includes an active area extending in a first direction on a substrate and a gate line extending in a second direction intersecting with the first direction to intersect with the active area. The gate line comprises a first sidewall and a second sidewall opposite to each other. The first sidewall has a convex shape. The second sidewall has a concave shape.

19 Claims, 14 Drawing Sheets

(56) References Cited

U.S. PATENT DOCUMENTS

| | | | |
|---|---|---|---|
| 5,481,553 A | 1/1996 | Suzuki et al. |
| 5,491,804 A | 2/1996 | Heath et al. |
| 5,583,457 A | 12/1996 | Horiguchi et al. |
| 5,783,956 A | 7/1998 | Ooishi |
| 5,892,900 A | 4/1999 | Ginter et al. |
| 5,976,259 A | 11/1999 | Yamazaki |
| 6,081,757 A | 6/2000 | Breed et al. |
| 6,289,306 B1 | 9/2001 | Van Der Vleuten et al. |
| 6,297,627 B1 | 10/2001 | Towne et al. |
| 6,388,533 B2 | 5/2002 | Swoboda |
| 6,403,943 B2 | 6/2002 | Wada et al. |
| 6,583,972 B2 | 6/2003 | Verhaege et al. |
| 6,618,048 B1 | 9/2003 | Leather |
| 6,624,699 B2 | 9/2003 | Yin et al. |
| 6,630,885 B2 | 10/2003 | Hardman et al. |
| 6,690,347 B2 | 2/2004 | Jeon et al. |
| 6,695,936 B2 | 2/2004 | Johnson |
| 6,798,148 B2 | 9/2004 | Inukai |
| 6,825,644 B2 | 11/2004 | Kernahan et al. |
| 6,855,929 B2 | 2/2005 | Kimba et al. |
| 6,856,546 B2 | 2/2005 | Guterman et al. |
| 6,867,638 B2 | 3/2005 | Saiki et al. |
| 6,998,722 B2 | 2/2006 | Madurawe |
| 7,053,009 B2 | 5/2006 | Conley, Jr. et al. |
| 7,053,890 B2 | 5/2006 | Inukai |
| 7,084,666 B2 | 8/2006 | Madurawe |
| 7,106,292 B2 | 9/2006 | Moon |
| 7,153,454 B2 | 12/2006 | Khoshnevis |
| 7,161,476 B2 | 1/2007 | Hardman et al. |
| 7,170,802 B2 | 1/2007 | Cernea et al. |
| 7,358,806 B2 | 4/2008 | Burns et al. |
| 7,403,424 B2 | 7/2008 | Hemink et al. |
| 7,408,804 B2 | 8/2008 | Hemink et al. |
| 7,486,564 B2 | 2/2009 | Hemink et al. |
| 7,733,659 B2 | 6/2010 | Snider et al. |
| 7,761,800 B2 | 7/2010 | Chaudhri et al. |
| 7,986,042 B2 | 7/2011 | Or-Bach et al. |
| 8,079,983 B2 | 12/2011 | Rush et al. |
| 8,250,271 B2 | 8/2012 | Swing et al. |
| 8,299,494 B2 | 10/2012 | Yilmaz et al. |
| 8,313,639 B2 | 11/2012 | Rothberg et al. |
| 8,626,223 B2 | 1/2014 | Brisebois et al. |
| 8,759,872 B2 | 6/2014 | Arghavani et al. |
| 8,838,135 B2 | 9/2014 | Moshfeghi |
| 8,971,124 B1 | 3/2015 | Manning |
| 9,160,287 B2 | 10/2015 | Briffa et al. |
| 9,219,445 B2 | 12/2015 | Nobbe et al. |
| 9,340,353 B2 | 5/2016 | Oren et al. |
| 9,413,298 B2 | 8/2016 | Nobbe et al. |
| 9,443,097 B2 | 9/2016 | O'Hare et al. |
| 9,483,610 B2 | 11/2016 | McMillen et al. |
| 9,716,477 B2 | 7/2017 | Wagh et al. |
| 9,730,105 B2 | 8/2017 | Bhushan et al. |
| 9,773,912 B2 * | 9/2017 | Chang ............... H01L 29/66795 |
| 9,806,166 B2 | 10/2017 | Myung et al. |
| 9,862,551 B2 | 1/2018 | Oren et al. |
| 9,969,564 B2 | 5/2018 | Oren et al. |
| 10,154,437 B2 | 12/2018 | Bhushan et al. |
| 10,177,240 B2 | 1/2019 | Greene et al. |
| 10,249,379 B2 | 4/2019 | Chung |
| 10,314,077 B2 | 6/2019 | Bhushan et al. |
| 10,504,798 B2 | 12/2019 | Xie et al. |
| 10,510,894 B2 | 12/2019 | Chang et al. |
| 2016/0336320 A1 * | 11/2016 | Lin ..................... H01L 27/0924 |
| 2017/0330801 A1 * | 11/2017 | Ragnarsson .... H01L 21/823842 |
| 2019/0341475 A1 | 11/2019 | Shu et al. |
| 2019/0378903 A1 * | 12/2019 | Jeon ............... H01L 21/823431 |
| 2020/0044051 A1 | 2/2020 | Bao et al. |
| 2021/0126109 A1 * | 4/2021 | Lin ................. H01L 21/823431 |

* cited by examiner

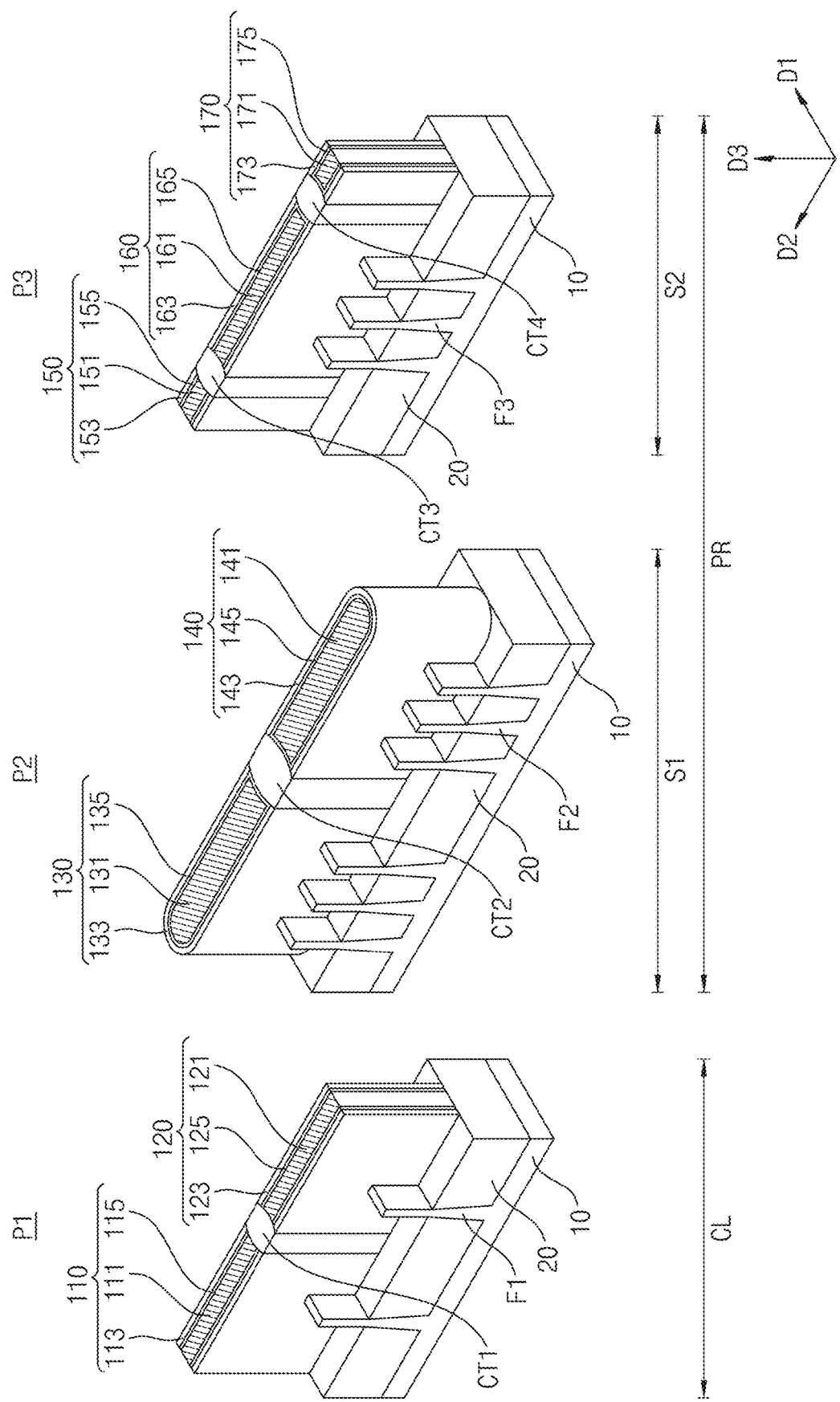

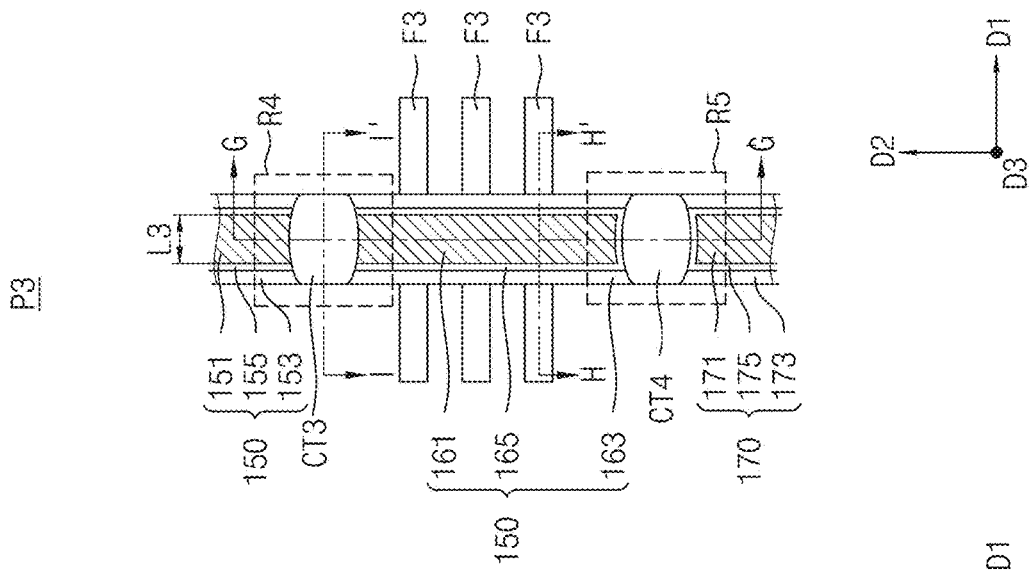
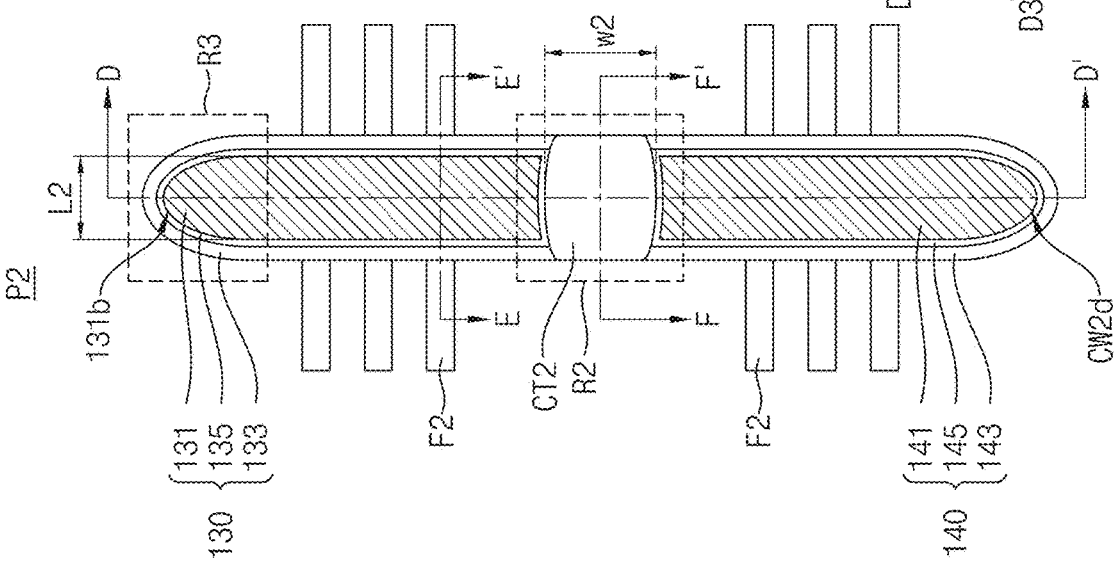
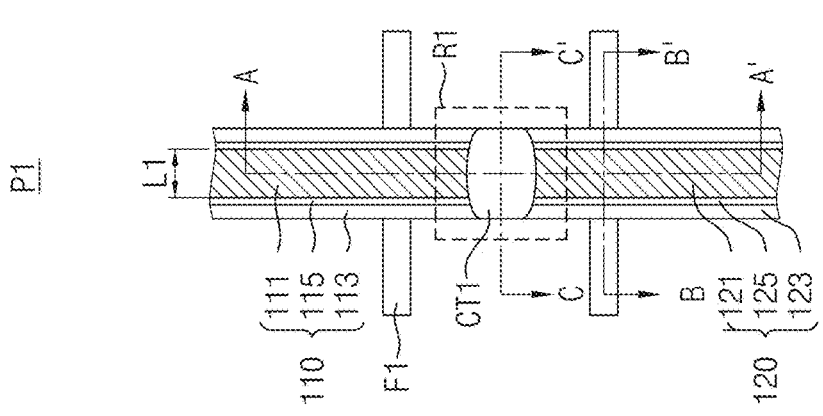

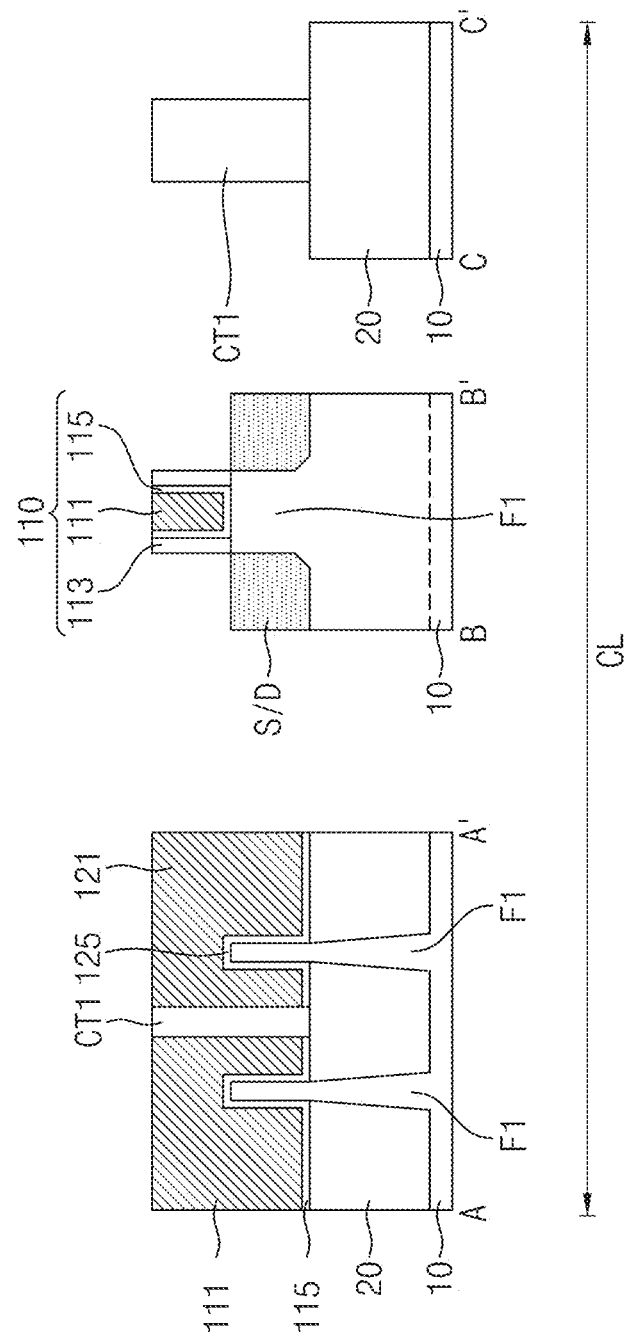

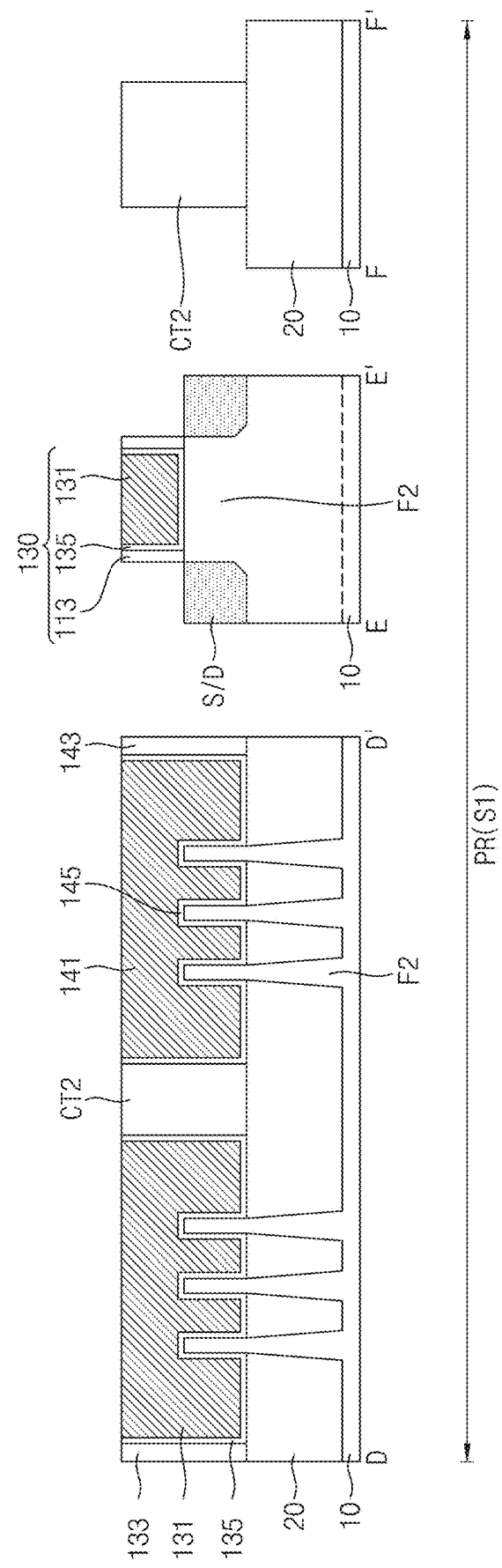

INTEGRATED CIRCUIT DEVICE INCLUDING GATE LINE

CROSS-REFERENCE TO THE RELATED APPLICATION

This application claims priority from Korean Patent Application No. 10-2020-0077166, filed on Jun. 24, 2020, in the Korean Intellectual Property Office, the disclosure of which is incorporated herein by reference in its entirety.

BACKGROUND

1. Field

The inventive concepts relate to an integrated circuit device including a gate line.

2. Description of the Related Art

As the design rule of semiconductor devices is reduced, a photolithography process of patterns needed for implementing semiconductor devices has a limitation in resolution, and due to this, has a limitation in forming patterns having a fine pitch.

SUMMARY

The example embodiments of the disclosure provide an integrated circuit device in which a structure for isolating gate lines is differently implemented for each area.

The example embodiments of the disclosure provide an integrated circuit device in which a structure for isolating gate lines is differently implemented for each of channel lengths of transistors.

An integrated circuit device in accordance with example embodiments of the disclosure may include an active area extending in a first direction on a substrate and a gate line extending in a second direction intersecting with the first direction to intersect with the active area, wherein the gate line may include a first sidewall and a second sidewall opposite to each other, the first sidewall may have a convex shape, and the second sidewall may have a concave shape.

An integrated circuit device in accordance with example embodiments of the disclosure may include a plurality of first active areas extending in a first direction on a substrate, a plurality of second active areas extending in the first direction on the substrate, a first gate line extending in a second direction intersecting with the first direction to intersect with the plurality of first active areas, the first gate line having a first width, a second gate line extending in the second direction to intersect with the plurality of second active areas, the second gate line having a second width which is narrower than the first width, a third gate line extending in the second direction apart from the second gate line in the second direction, the third gate line having the second width, and a first gate isolation layer between the second gate line and the third gate line, wherein the first gate line may include a curved surface and may include a first sidewall and a second sidewall having different curvatures, and the first gate isolation layer may contact the second gate line and the third gate line.

An integrated circuit device in accordance with example embodiments of the disclosure may include a substrate including a cell area, where a static random access memory (SRAM) cell is located, and a peri area where a peripheral circuit configured to operate the SRAM cell is located, a first upper gate line extending in one direction in the cell area, a first lower gate line extending in the one direction in the cell area apart from the first upper gate line in the one direction, a first gate isolation layer between the first upper gate line and the first lower gate line, a second upper gate line extending in one direction in the peri area, a second lower gate line extending in the one direction in the peri area apart from the second upper gate line in the one direction, and a second gate isolation layer between the second upper gate line and the second lower gate line, wherein the first gate isolation layer may contact the first upper gate line and the first lower gate line, the second gate isolation layer may be apart from the second upper gate line and the second lower gate line, and each of the second upper gate line and the second lower gate line may include a concave sidewall.

BRIEF DESCRIPTION OF THE DRAWINGS

FIG. 2 illustrates perspective views of main elements respectively corresponding to a P1 region, a P2 region, and a P3 region of FIG. 1.

FIG. 3 illustrates a plan view of a P1 region of FIG. 2.
FIG. 4 illustrates a plan view of a P2 region of FIG. 2.
FIG. 5 illustrates a plan view of a P3 region of FIG. 2.
FIG. 6 illustrates cross-sectional views respectively taken along line A-A', line B-B', and line C-C' of FIG. 3.
FIG. 7 illustrates cross-sectional views respectively taken along line D-D', line E-E', and line F-F' of FIG. 3.

DETAILED DESCRIPTION OF EXAMPLE EMBODIMENTS

Figure 1:
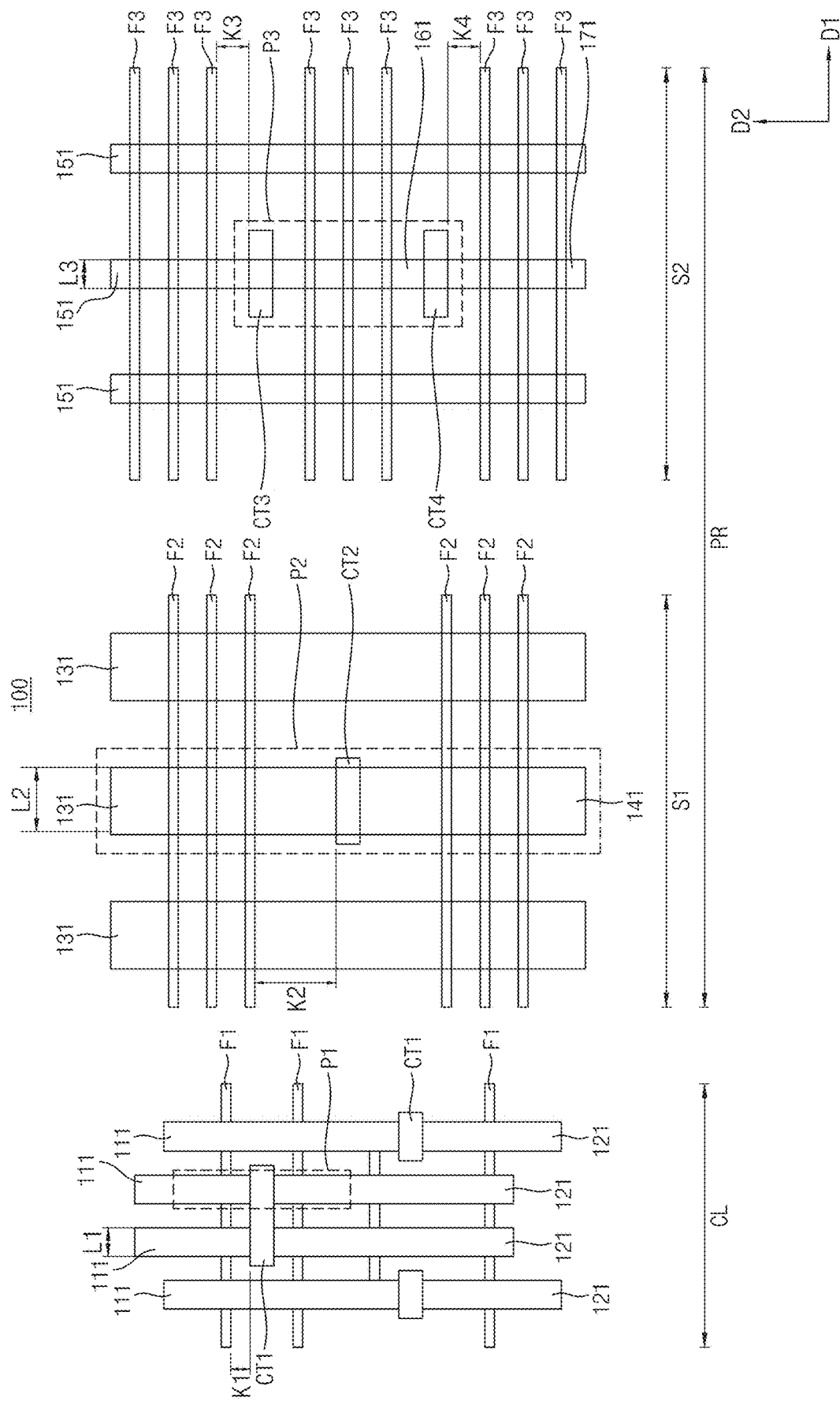
FIG. 1 is a plan layout illustrating main elements of an integrated circuit device according to example embodiments of the disclosure.

FIG. 1 is a plan layout illustrating main elements of an integrated circuit device 100 according to example embodiments of the disclosure.

Referring to FIG. 1, the integrated circuit device 100 may include a cell area CL and a peri area PR. The cell area CL and the peri area PR may be areas connected to each other, or may be areas apart from each other. The cell area CL and the peri area PR may be areas of performing different functions. The cell area CL may be a memory area, and the peri area PR may be a non-memory area. For example, the memory area may include a static random access memory (SRAM) area, a dynamic random access memory (DRAM) area, a resistive random access memory (RRAM) area, or a phase random access memory (PRAM) area, and the non-memory area may include a logic area. In example embodiments, the cell area CL may be a partial area configuring the SRAM area, and the peri area may be a partial area configuring the logic area. For example, an SRAM cell may be disposed in the cell area CL, and a peripheral circuit for operating the SRAM cell may be disposed in the peri area PR.

The cell area CL and the peri area PR of the integrated circuit device 100 may include a plurality of active areas F1 to F3, a plurality of gate lines 111, 121, 131, 141, 151, and 161, and/or a plurality of gate isolation layers CT1 to CT4. The plurality of active areas F1 to F3 may extend in a first direction D1. For example, each of the active regions F1, F2, F3 may be a fin-type active region. The plurality of gate lines 111, 121, 131, 141, 151, and 161 may extend in a second direction D2 intersecting with the first direction D1. A plurality of transistors may be formed in a plurality of areas defined by intersections of the plurality of active areas F1 to F3 and the plurality of gate lines 111, 121, 131, 141, 151, and 161. Channel areas of the plurality of transistors may be formed in the plurality of areas defined by intersections of the plurality of active areas F1 to F3 and the plurality of gate lines 111, 121, 131, 141, 151, and 161.

The cell area CL of the integrated circuit device 100 may include a plurality of first active areas F1 extending in the first direction D1. The plurality of first active areas F1 may be disposed apart from one another in the second direction D2 in parallel. A pitch between the plurality of first active areas F1 may be variable, and a pitch between two adjacent first active areas F1 may vary based on positions of active areas of the cell area CL. The cell area CL of the integrated circuit device 100 may include a plurality of first upper gate lines 111 and first lower gate lines 121, which extend in the second direction D2 and intersect with the plurality of first active areas F1. The plurality of first upper gate lines 111 and first lower gate lines 121 may be physically isolated from one another by a first gate isolation layer CT1.

In example embodiments, the peri area PR may include a first area S1 and a second area S2. The first area S1 and the second area S2 may be disposed apart from each other in the peri area PR, or may be disposed adjacent to each other. The first area S1 may be an area where a plurality of transistors each including a channel area having a relatively long length are disposed, and the second area S2 may be an area where a plurality of transistors each including a channel area having a relatively short length are disposed. That is, the first area S1 may be an area where a plurality of gate lines having a relatively large width are disposed, and the second area S2 may be an area where a plurality of gate lines having a relatively small width are disposed. For example, a length of the channel area of each of the plurality of transistors disposed in the first area S1 may be 20 nm or more. A length of the channel area of each of the plurality of transistors disposed in the second area S2 may be less than 20 nm.

A plurality of second active areas F2 may be disposed in the first area S1 of the peri area PR. The plurality of second active areas F2 may be disposed apart from one another in the second direction D2 in parallel. A pitch between adjacent second active areas F2 may be constant.

A plurality of second upper gate lines 131 and second lower gate lines 141 extending in the second direction D2 may be disposed in the first area S1 of the peri area PR. The plurality of second upper gate lines 131 and second lower gate lines 141 may intersect with the plurality of second active areas F2. The plurality of second upper gate lines 131 and second lower gate lines 141 may be physically isolated from one another by a second gate isolation layer CT2.

A plurality of third active areas F3 may be disposed in the second area S2 of the peri area PR. The plurality of third active areas F3 may be disposed apart from one another in the second direction D2 in parallel. In example embodiments, a pitch between adjacent third active areas F3 may differ from the pitch between the plurality of second active areas F2.

In example embodiments, a width L1 of each of the first upper gate line 111 and the first lower gate line 121 disposed in the cell area CL may be narrower than a width L2 of each of the second upper gate line 131 and the second lower gate line 141 disposed in the first area S1 of the pen area PR. Also, a width L3 of each of a third upper gate line 151, a third middle gate line 161, and a third lower gate line 171 disposed in the second area S2 of the pen area PR may be narrower than the width L2 of each of the second upper gate line 131 and the second lower gate line 141 disposed in the first area S1 of the pen area PR.

In example embodiments, a density of a plurality of structures configured by a combination of the gate lines 111 and 121 and the active areas F1 in the cell area CL may be greater than a density of a plurality of structures configured by a combination of the active areas F2 and F3 and the gate lines 131, 141, 151, 161, and 171 in the peri area PR. A density of a plurality of structures configured by a combination of the second active areas F2 and the gate lines 131 and 141 in the first area S1 of the peri area PR may be less than a density of a plurality of structures configured by a combination of the second active areas F2 and the gate lines 151, 161, and 171 in the second area S2 of the peri area PR.

In example embodiments, a shortest distance K1 between the first active area F1 and the first gate isolation layer CT1 in the cell area CL may be closer than a shortest distance K2 between the second active area F2 and the second gate isolation layer CT2 in the first area S1 of the peri area PR. A shortest distance K3 between the third active area F3 and a third gate isolation layer CT3 in the second area S2 of the peri area PR may be closer than the shortest distance K2 between the second active area F2 and the second gate isolation layer CT2 in the first area S1 of the peri area PR. A shortest distance K4 between the third active area F3 and a fourth gate isolation layer CT4 in the second area S2 of the peri area PR may be closer than the shortest distance K2 between the second active area F2 and the second gate isolation layer CT2 in the first area S1 of the peri area PR.

Figure 8:
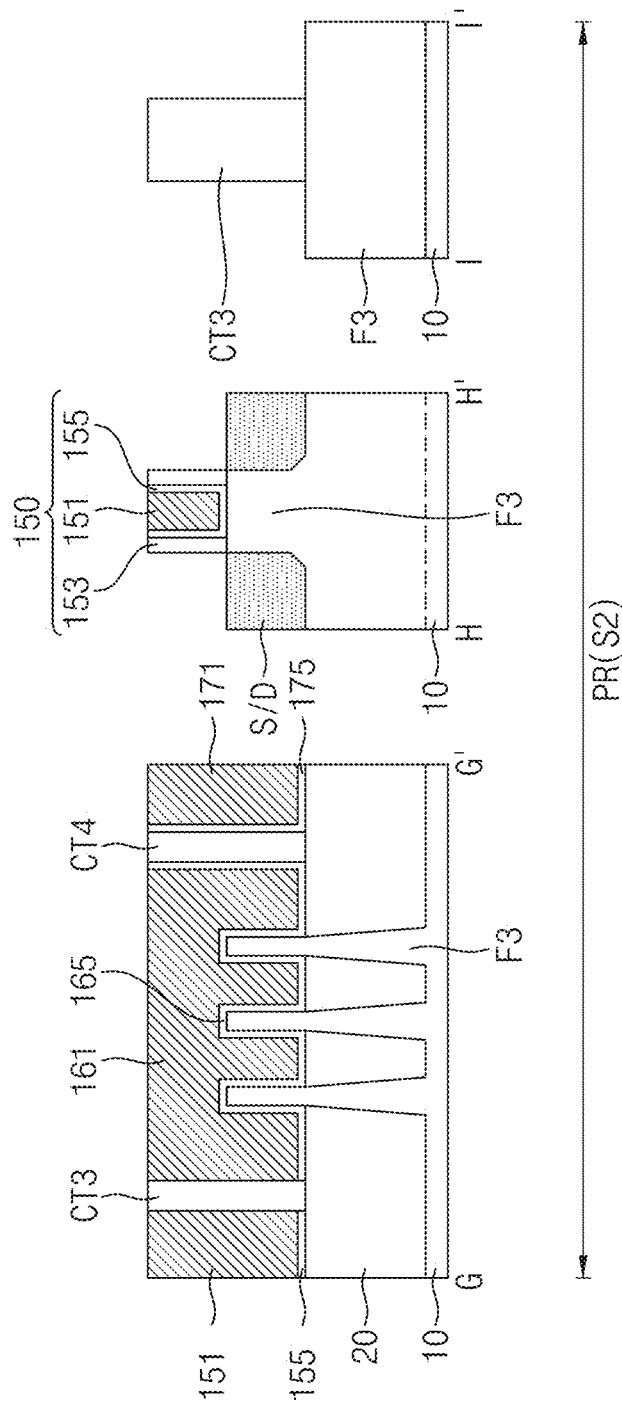
FIG. 8 illustrates cross-sectional views respectively taken along line G-G', line H-H', and line I-I' of FIG. 3.

FIG. 2 illustrates perspective views of main elements respectively corresponding to a P1 region, a P2 region, and a P3 region of FIG. 1. FIG. 3 illustrates a plan view of a P1 region of FIG. 2. FIG. 4 illustrates a plan view of a P2 region of FIG. 2. FIG. 5 illustrates a plan view of a P3 region of FIG. 2. FIG. 6 illustrates cross-sectional views respectively taken along line A-A', line B-B', and line C-C' of FIG. 3. FIG. 7 illustrates cross-sectional views respectively taken along line D-D', line E-E', and line F-F' of FIG. 3. FIG. 8 illustrates cross-sectional views respectively taken along line G-G', line H-H', and line I-I' of FIG. 3.

Referring to FIGS. 2 to 8, an integrated circuit device 100 according to example embodiments may include a plurality of active areas F1 to F3, an isolation layer 20, a plurality of sources/drains S/D, a plurality of gate structures 110 to 170, and/or a plurality of gate isolation layers CT1 to CT4, which are disposed on a substrate 10.

The substrate 10 may include a semiconductor, such as silicon (Si) or germanium (Ge), or a compound semiconductor such as SiGe, SiC, GaAs, InAs, or InP. The substrate 10 may include at least one of Groups III-V materials and Group IV materials. As another example, the substrate 10 may have a silicon on insulator (SOI) structure. The substrate 10 may include a conductive area, and for example, an impurity-doped well or an impurity-doped structure.

The plurality of active areas F1 to F3 may each have a line or bar shape which protrudes from the substrate 10 and extends in a first direction D1. In FIGS. 2 to 8, the arrangement type and number of the active areas F1 to F3 are arbitrarily illustrated in each region, but the arrangement type and number of the active areas F1 to F3 are not limited thereto. Each of the plurality of active areas F1 to F3 may be a portion of the substrate 10 and may include an epitaxial layer grown from the substrate 10.

The isolation layer 20 may cover a top surface of the substrate 10 and lower sidewalls of the plurality of active areas F1 to F3. Upper portions of the plurality of active areas F1 to F3 may protrude to above a top surface of the isolation layer 20. The isolation layer 20 may include an insulating material. For example, the isolation layer 20 may include oxide, nitride, or a combination thereof.

The plurality of gate structures 110 to 170 may extend in a second direction D2 intersecting with the plurality of active areas F1 to F3. The plurality of gate structures 110 to 170 may respectively include a plurality of gate lines 111, 121, 131, 141, 151, 161, and 171, a plurality of gate spacers 113, 123, 133, 143, 153, 163, and 173, and a plurality of gate dielectric layers 115, 125, 135, 145, 155, 165, and 175.

The plurality of gate lines 111, 121, 131, 141, 151, 161, and 171 may extend in the second direction D2 on the substrate 10 and the isolation layer 20. The plurality of gate lines 111, 121, 131, 141, 151, 161, and 171 may extend to cover the upper portions of the plurality of active areas F1 to F3 and to intersect with the plurality of active areas F1 to F3. In example embodiments, the plurality of gate lines 111, 121, 131, 141, 151, 161, and 171 may each have a structure where a metal nitride layer, a metal layer, a conductive capping layer, and a gap-fill metal layer are sequentially stacked. In example embodiments, the gap-fill metal layer may be omitted. Each of the metal nitride layer and the metal layer may include at least one metal selected from among titanium (Ti), tantalum (Ta), tungsten (W), ruthenium (Ru), niobium (Nb), molybdenum (Mo), and hafnium (Hf). Each of the metal nitride layer and the metal layer may be formed by an atomic layer deposition (ALD) process, a metal organic ALD (MOALD) process, or a metal organic chemical vapor deposition (MOCVD) process. The conductive capping layer may act as a protection layer for reducing or preventing a surface of the metal layer from being oxidized. Also, the conductive capping layer may act as a wetting layer which enables deposition to be easily performed in a process of depositing another conductive layer on the metal layer. The conductive capping layer may include metal nitride, and for example, may include TiN, TaN, or a combination thereof, but is not limited thereto. The gap-fill metal layer may extend to above the conductive capping layer. The gap-fill metal layer may include a W layer or a TiN layer. The gap-fill metal layer may be formed by an ALD process, a chemical vapor deposition (CVD) process, or a physical vapor deposition (PVD) process. The gap-fill metal layer may bury a recess space formed by a stepped portion in a top surface of the conductive capping layer, without a void.

The plurality of gate spacers 113, 123, 133, 143, 153, 163, and 173 may be disposed on both sidewalls of the plurality of gate lines 111, 121, 131, 141, 151, 161, and 171. The plurality of gate spacers 113, 123, 133, 143, 153, 163, and 173 may extend in the first direction D1 along sidewalls of the plurality of gate lines 111, 121, 131, 141, 151, 161, and 171, on the isolation layer 20. The plurality of gate spacers 113, 123, 133, 143, 153, 163, and 173 may each have a multi-layer structure. For example, the plurality of gate spacers 113, 123, 133, 143, 153, 163, and 173 may each include SiN, SiOCN, SiCN, or a combination thereof.

The plurality of gate dielectric layers 115, 125, 135, 145, 155, 165, and 175 may be disposed between the plurality of gate lines 111, 121, 131, 141, 151, 161, and 171 and the plurality of gate spacers 113, 123, 133, 143, 153, 163, and 173 and may extend in the second direction D2 along the plurality of gate lines 111, 121, 131, 141, 151, 161, and 171. Also, the plurality of gate dielectric layers 115, 125, 135, 145, 155, 165, and 175 may be disposed between the plurality of gate lines 111, 121, 131, 141, 151, 161, and 171 and the isolation layer 20 and between the plurality of gate lines 111, 121, 131, 141, 151, 161, and 171 and the upper portions of the plurality of active areas F1 to F3 and may extend in the second direction D2 along the top surface of the isolation layer 20 and upper profiles of the plurality of active areas F1 to F3. For example, the plurality of gate dielectric layers 115, 125, 135, 145, 155, 165, and 175 may each include silicon oxide, a high-k dielectric film, or a combination thereof. The high-k dielectric film may include a material which is greater in dielectric constant than silicon oxide. The high-k dielectric film may include $HfO_2$, HfSiO, HfSiON, HfTaO, HfTiO, HfZrO, $ZrO_2$, $Al_2O_3$, a $HfO_2$—$Al_2O_3$ alloy, or a combination thereof. The plurality of gate dielectric layers 115, 125, 135, 145, 155, 165, and 175 may be formed by an ALD process, a CVD process, or a PVD process.

The plurality of gate isolation layers CT1 to CT4 may be disposed between the plurality of gate structures 110 to 170. The plurality of gate isolation layers CT1 to CT4 may physically isolate the plurality of gate structures 110 to 170 disposed adjacent to one another on the same line. For example, the plurality of gate isolation layers CT1 to CT4 may include a single insulating material or a plurality of insulating materials. For example, the plurality of gate isolation layers CT1 to CT4 may include at least one of silicon oxide and silicon oxide. Furthermore, the plurality of gate isolation layers CT1 to CT4 may each include an air spacer therein.

The plurality of sources/drains S/D may be disposed in the plurality of active areas F1 to F3. The plurality of active areas F1 to F3 may be partially recessed from both sides of the plurality of gate structures 110 to 170, and the plurality of sources/drains S/D may be disposed in a recessed area. The plurality of sources/drains S/D may each include an epitaxial layer and may include impurities.

Referring to FIGS. 1, 2, 3, and 6, an integrated circuit device 100 may include a plurality of first active areas F1, a first upper gate structure 110, a first lower gate structure 120, and/or a first gate isolation layer CT1, which are disposed in the cell area CL.

The first upper gate structure 110 may include a first upper gate line 111, a first upper gate spacer 113, and a first upper gate dielectric layer 115. The first lower gate structure 120 may include a first lower gate line 121, a first lower gate spacer 123, and a first lower gate dielectric layer 125.

The first upper gate line 111 may extend in the second direction D2, on the isolation layer 20 and may cover upper portions of the plurality of first active areas F1 protruding to above the isolation layer 20. The first lower gate line 121 may extend in the second direction D2, on the isolation layer 20 and may cover the upper portions of the plurality of first active areas F1 protruding to above the isolation layer 20. The first lower gate line 121 may be apart from the first upper gate line 111 in the second direction D2. The first upper gate line 111 and the first lower gate line 121 may be disposed on the same line in the second direction D2.

The first upper gate spacer 113 may be disposed on each of both sidewalls of the first upper gate line 111 and may long extend in the second direction D2. The first upper gate spacer 113 may be apart from the first upper gate line 111. The first lower gate spacer 123 may be disposed on each of the both sidewalls of the first upper gate line 111 and may long extend in the second direction D2. The first lower gate spacer 123 may be apart from the first lower gate line 121.

The first upper gate dielectric layer 115 may surround a bottom surface and both sidewalls of the first upper gate line 111 and may have a U-shape. A portion of the first upper gate dielectric layer 115 may extend along the top surface of the isolation layer 20 and profiles of the plurality of first active areas F1. A portion of the first upper gate dielectric layer 115 may be disposed between the first upper gate line 111 and the isolation layer 20 and between the first upper gate line 111 and the plurality of first active areas F1. A portion of the first upper gate dielectric layer 115 may cover both sidewalls of the first upper gate line 111 and may be disposed between the first upper gate line 111 and the first upper gate spacer 113.

The first lower gate dielectric layer 125 may surround a bottom surface and both sidewalls of the first lower gate line 121 and may have a U-shape. A portion of the first lower gate dielectric layer 125 may extend along the top surface of the isolation layer 20 and the profiles of the plurality of first active areas F1. A portion of the first lower gate dielectric layer 125 may be disposed between the first lower gate line 121 and the isolation layer 20 and between the first lower gate line 121 and the plurality of first active areas F1. A portion of the first lower gate dielectric layer 125 may cover both sidewalls of the first lower gate line 121 and may be disposed between the first lower gate line 121 and the first lower gate spacer 123.

The first gate isolation layer CT1 may be disposed between the first upper gate structure 110 and the first lower gate structure 120. The first gate isolation layer CT1 may contact the first upper gate line 111 and the first lower gate line 121. The first gate isolation layer CT1 may contact the first upper gate dielectric layer 115 and the first lower gate dielectric layer 125. Also, the first gate isolation layer CT1 may contact the first upper gate spacer 113 and the first lower gate spacer 123.

Referring to FIGS. 1, 2, 4, and 7, an integrated circuit device 100 may include a plurality of second active areas F2, a second upper gate structure 130, a second lower gate structure 140, and/or a second gate isolation layer CT2, which are disposed in the first area S1 of the peri area PR.

The second upper gate structure 130 may include a second upper gate line 131, a second upper gate spacer 133, and a second upper gate dielectric layer 135. The second lower gate structure 140 may include a second lower gate line 141, a second lower gate spacer 143, and a second lower gate dielectric layer 145.

The second upper gate line 131 may extend in the second direction D2, on the isolation layer 20 and may cover upper portions of the plurality of second active areas F2 protruding to above the isolation layer 20. The second lower gate line 141 may extend in the second direction D2, on the isolation layer 20 and may be apart from the second upper gate line 131 in the second direction D2. The second upper gate line 131 and the second lower gate line 141 may be disposed on the same line in the second direction D2.

The second upper gate spacer 133 may be disposed on each of both sidewalls of the second upper gate line 131 and may long extend in the second direction D2. The second upper gate spacer 133 may be apart from the second upper gate line 131. The second lower gate spacer 143 may be disposed on each of the both sidewalls of the second upper gate line 131 and may long extend in the second direction D2. The second lower gate spacer 143 may be apart from the second lower gate line 141.

The second upper gate dielectric layer 135 may surround a bottom surface and both sidewalls of the second upper gate line 131 and may have a U-shape. A portion of the second upper gate dielectric layer 135 may extend along the top surface of the isolation layer 20 and profiles of the plurality of second active areas F2. A portion of the second upper gate dielectric layer 135 may be disposed between the second upper gate line 131 and the isolation layer 20 and between the second upper gate line 131 and the plurality of second active areas F2. A portion of the second upper gate dielectric layer 135 may cover both sidewalls of the second upper gate line 131 and may be disposed between the second upper gate line 131 and the second upper gate spacer 133. Also, a portion of the second upper gate dielectric layer 135 may be disposed between the second upper gate line 131 and the second gate isolation layer CT2. The second upper gate dielectric layer 135 may cover one sidewall of the second gate isolation layer CT2.

The second lower gate dielectric layer 145 may surround a bottom surface and both sidewalls of the second lower gate line 141 and may have a U-shape. A portion of the second lower gate dielectric layer 145 may extend along the top surface of the isolation layer 20 and the profiles of the plurality of second active areas F2. A portion of the second lower gate dielectric layer 145 may be disposed between the second lower gate line 141 and the isolation layer 20 and between the second lower gate line 141 and the plurality of second active areas F2. A portion of the second lower gate dielectric layer 145 may cover both sidewalls of the second lower gate line 141 and may be disposed between the second lower gate line 141 and the second lower gate spacer 143. Also, a portion of the second lower gate dielectric layer 145 may be disposed between the second lower gate line 141 and the second gate isolation layer CT2. The second lower gate dielectric layer 145 may cover one sidewall of the second gate isolation layer CT2.

The second gate isolation layer CT2 may be disposed between the second upper gate structure 130 and the second lower gate structure 140. The second gate isolation layer CT2 may be apart from the second upper gate line 131 and the second lower gate line 141. The second gate isolation layer CT2 may contact the second upper gate dielectric layer 135 and the second lower gate dielectric layer 145. Also, the second gate isolation layer CT2 may contact the second upper gate spacer 133 and the second lower gate spacer 143.

Referring to FIGS. 1, 2, 5, and 8, an integrated circuit device 100 may include a plurality of third active areas F3, a third upper gate structure 150, a third middle gate structure 160, a third lower gate structure 170, a third gate isolation layer CT3, and/or a fourth gate isolation layer CT4, which are disposed in the second area S2 of the peri area PR.

The third upper gate structure 150 may include a third upper gate line 151, a third upper gate spacer 153, and a third upper gate dielectric layer 155. The third middle gate structure 160 may include a third middle gate line 161, a third middle gate spacer 163, and a third middle gate dielectric layer 165. The third lower gate structure 170 may include a third lower gate line 171, a third lower gate spacer 173, and a third lower gate dielectric layer 175.

The third upper gate line 151 may extend in the second direction D2, on the isolation layer 20. The third middle gate line 161 may extend in the second direction D2, on the isolation layer 20 and may intersect with the plurality of third active areas F3 protruding to above the isolation layer 20. The third middle gate line 161 may be apart from the third upper gate line 151 in the second direction D2. The third lower gate line 171 may extend in the second direction D2, on the isolation layer 20 and may be apart from the third middle gate line 161 in the second direction D2. The third upper gate line 151, the third middle gate line 161, and the third lower gate line 171 may be disposed on the same line in the third direction D2. The third middle gate line 161 may be disposed between the third upper gate line 151 and the third lower gate line 171 in the second direction D2.

The third upper gate spacer 153 may be disposed on each of both sidewalls of the third upper gate line 151 and may long extend in the second direction D2. The third upper gate spacer 153 may be apart from the third upper gate line 151. The third middle gate spacer 163 may be disposed on each of both sidewalls of the third middle gate line 161 and may long extend in the second direction D2. The third middle gate spacer 163 may be apart from the third middle gate line 161. The third lower gate spacer 173 may be disposed on each of the both sidewalls of the third upper gate line 151 and may long extend in the second direction D2. The third lower gate spacer 173 may be apart from the third lower gate line 171.

The third upper gate dielectric layer 155 may cover both sidewalls of the third upper gate line 151 and may be disposed between the third upper gate line 151 and the third upper gate spacer 153. The third middle gate dielectric layer 165 may surround a bottom surface and both sidewalls of the third middle gate line 161 and may have a U-shape. A portion of the third middle gate dielectric layer 165 may extend along the top surface of the isolation layer 20 and profiles of the plurality of third active areas F3. A portion of the third middle gate dielectric layer 165 may be disposed between the third middle gate line 161 and the isolation layer 20 and between the third middle gate line 161 and the plurality of third active areas F3. A portion of the third middle gate dielectric layer 165 may cover both sidewalls of the third middle gate line 161 and may be disposed between the third middle gate line 161 and the third middle gate spacer 163. A portion of the third middle gate dielectric layer 165 may be disposed between the third middle gate line 161 and the fourth gate isolation layer CT4. The third middle gate dielectric layer 165 may cover one sidewall of the fourth gate isolation layer CT4. A portion of the third lower gate dielectric layer 175 may cover both sidewalls of the third lower gate line 171 and may be disposed between the third lower gate line 171 and the third lower gate spacer 173. A portion of the third lower gate dielectric layer 175 may be disposed between the third lower gate line 171 and the fourth gate isolation layer CT4. The third lower gate dielectric layer 175 may cover one sidewall of the fourth gate isolation layer CT4.

The third gate isolation layer CT3 may be disposed between the third upper gate structure 150 and the third middle gate structure 160. The third gate isolation layer CT3 may contact the third upper gate line 151 and the third middle gate line 161. The third gate isolation layer CT3 may contact the third upper gate dielectric layer 155 and the third middle gate dielectric layer 165. Also, the third gate isolation layer CT3 may contact the third upper gate spacer 153 and the third lower gate spacer 173.

The fourth gate isolation layer CT4 may be disposed between the third middle gate structure 160 and the third lower gate structure 170. The fourth gate isolation layer CT4 may be apart from the third middle gate line 161 and the third lower gate line 171. The fourth gate isolation layer CT4 may contact the third middle gate dielectric layer 165 and the third lower gate dielectric layer 175. Also, the fourth gate isolation layer CT4 may contact the third middle gate spacer 163 and the third lower gate spacer 173.

Figure 9:
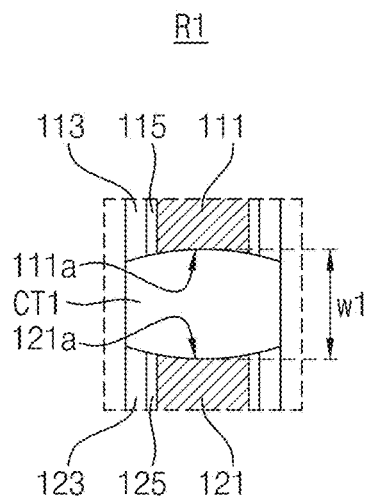
FIG. 9 is an enlarged view illustrating the enlargement of an R1 region of FIG. 3.
Figure 10:
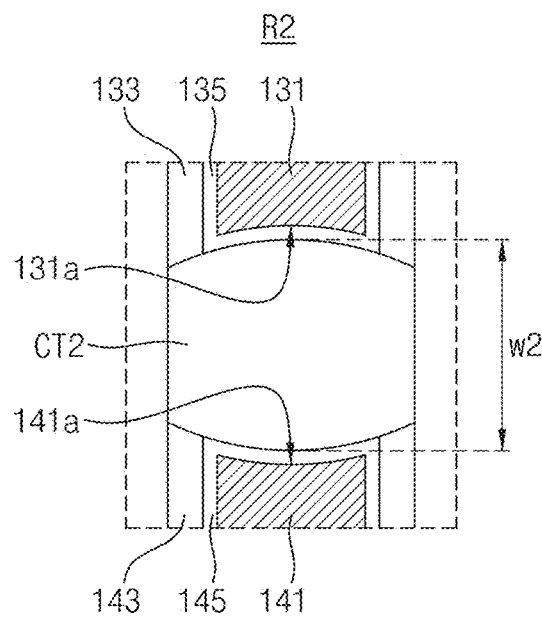
FIG. 10 is an enlarged view illustrating the enlargement of an R2 region of FIG. 4.
Figure 11:
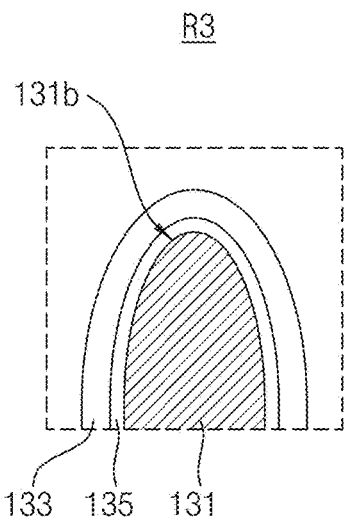
FIG. 11 is an enlarged view illustrating the enlargement of an R3 region of FIG. 4.
Figure 12:
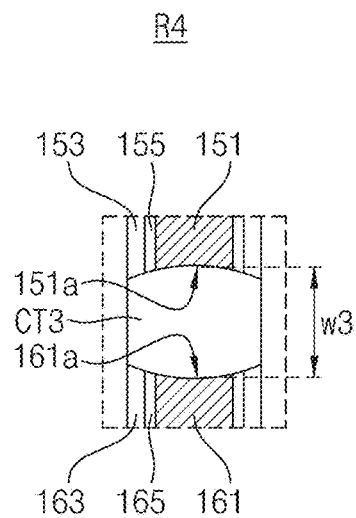
FIG. 12 is an enlarged view illustrating the enlargement of an R4 region of FIG. 5.
Figure 13:
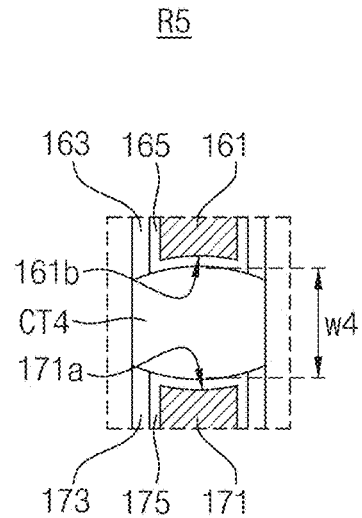
FIG. 13 is an enlarged view illustrating the enlargement of an R5 region of FIG. 5.

FIG. 9 is an enlarged view illustrating the enlargement of an R1 region of FIG. 3. FIG. 10 is an enlarged view illustrating the enlargement of an R2 region of FIG. 4. FIG. 11 is an enlarged view illustrating the enlargement of an R3 region of FIG. 4. FIG. 12 is an enlarged view illustrating the enlargement of an R4 region of FIG. 5. FIG. 13 is an enlarged view illustrating the enlargement of an R5 region of FIG. 5.

Referring to FIGS. 3 and 9, in example embodiments, a first upper gate line 111 disposed in the cell area CL may include a first upper sidewall 111a, and a first lower gate line 121 disposed in the cell area CL may include a first lower sidewall 121a. The first upper sidewall 111a and the first lower sidewall 121a may each extend in the first direction D1. The first upper sidewall 111a and the first lower sidewall 121a may be apart from each other in the second direction D2 and may face each other. Each of the first upper sidewall 111a and the first lower sidewall 121a may include a curved surface. Each of the first upper sidewall 111a and the first lower sidewall 121a may have a concave shape. The first upper sidewall 111a may be formed to be concave toward the first upper gate line 111, and the first lower sidewall 121a may be formed to be concave toward the first lower gate line 121. A first gate isolation layer CT1 may be disposed between the first upper sidewall 111a and the first lower sidewall 121a. Each of the first upper sidewall 111a and the first lower sidewall 121a may contact the first gate isolation layer CT1. The first gate isolation layer CT1 may include a plurality of sidewalls which are formed to be convex along the first upper sidewall 111a and the first lower sidewall 121a. Accordingly, a width w1 of the first gate isolation layer CT1 in the second direction D2 may be widest at a center portion of the first gate isolation layer CT1.

Referring to FIGS. 4 and 10, a second upper gate line 131 disposed in the first area S1 of the peri area PR may include a second upper sidewall 131a, and a second lower gate line 141 disposed in the first area S1 may include a second lower sidewall 141a. The second upper sidewall 131a and the second lower sidewall 141a may each extend in the first direction D1. The second upper sidewall 131a and the second lower sidewall 141a may be apart from each other in the second direction D2 and may face each other. Each of the second upper sidewall 131a and the second lower sidewall 141a may include a curved surface. Each of the second upper sidewall 131a and the second lower sidewall 141a may have a concave shape. The second upper sidewall 131a may be formed to be concave toward the second upper gate line 131, and the second lower sidewall 141a may be formed to be concave toward the second lower gate line 141. A second gate isolation layer CT2 may be disposed between the second upper sidewall 131a and the second lower sidewall 141a. The second upper sidewall 131a may be disposed adjacent to the second gate isolation layer CT2. The second lower sidewall 141a may be disposed adjacent to the second gate isolation layer CT2. Each of the second upper sidewall 131a and the second lower sidewall 141a may be apart from the second gate isolation layer CT2. A second upper gate dielectric layer 135 may be disposed between the second upper sidewall 131a and the second gate isolation layer CT2. A second lower gate dielectric layer 145 may be disposed between the second lower sidewall 141a and the second gate isolation layer CT2. The second upper sidewall 131a may be covered by the second upper gate dielectric layer 135, and the second lower sidewall 141a may be covered by the second lower gate dielectric layer 145. The second upper gate dielectric layer 135 may extend along a profile of the second upper sidewall 131a. The second lower gate dielectric layer 145 may extend along a profile of the second lower sidewall 141a.

The second gate isolation layer CT2 may include a plurality of sidewalls which are convexly formed to contact the second upper gate dielectric layer 135 and the second lower gate dielectric layer 145. Accordingly, a width w2 of the second gate isolation layer CT2 in the second direction D2 may be widest at a center portion of the second gate isolation layer CT2.

Comparing FIG. 9 with FIG. 10, the maximum width w2 of the second gate isolation layer CT2 in the second direction D2 may be wider than the maximum width w1 of the first gate isolation layer CT1 in the second direction D2. Also, a horizontal width of the second gate isolation layer CT2 may be wider than a horizontal width of the first gate isolation layer CT1.

Referring to FIGS. 4, 10, and 11, in example embodiments, a second upper gate line 131 may include an upper end sidewall 131b. The upper end sidewall 131b may extend in the first direction D1 and may be opposite to the second upper sidewall 131a. The upper end sidewall 131b may include a curved surface. The upper end sidewall 131b may have a convex shape. In example embodiments, the upper end sidewall 131b may have a curvature which differs from that of the second upper sidewall 131a. A curvature of the upper end sidewall 131b may be greater than that of the second upper sidewall 131a. The upper end sidewall 131b may be covered by a second upper gate dielectric layer 135.

Referring to FIGS. 5 and 12, in example embodiments, a third upper gate line 151 may include a third upper sidewall 151a, and a third middle gate line 161 may include a third middle upper sidewall 161a. Each of the third upper sidewall 151a and the third middle upper sidewall 161a may extend in the first direction D1. The third upper sidewall 151a and the third middle upper sidewall 161a may be apart from each other in the second direction D2 and may face each other. Each of the third upper sidewall 151a and the third middle upper sidewall 161a may include a curved surface. Each of the third upper sidewall 151a and the third middle upper sidewall 161a may have a concave shape. The third upper sidewall 151a may be formed to be concave toward the third upper gate line 151, and the third middle upper sidewall 161a may be formed to be concave toward the third middle gate line 161. A third gate isolation layer CT3 may be disposed between the third upper sidewall 151a and the third middle upper sidewall 161a. Each of the third upper sidewall 151a and the third middle upper sidewall 161a may contact the third gate isolation layer CT3. The third gate isolation layer CT3 may include a plurality of sidewalls which are formed to be convex along the third upper sidewall 151a and the third middle upper sidewall 161a. Accordingly, a width w3 of the third gate isolation layer CT3 in the second direction D2 may be widest at a center portion of the third gate isolation layer CT3.

Comparing FIG. 10 with FIG. 12, the maximum width w3 of the third gate isolation layer CT3 in the second direction D2 may be less than the maximum width w2 of the second gate isolation layer CT2 in the second direction D2.

Referring to FIGS. 5 and 13, in example embodiments, a third middle gate line 161 may include a third middle lower sidewall 161b, and a third lower gate line 171 may include a third lower sidewall 171a. Each of the third middle lower sidewall 161b and the third lower sidewall 171a may extend in the first direction D1. The third middle lower sidewall 161b and the third lower sidewall 171a may be apart from each other in the second direction D2 and may face each other. Each of the third middle lower sidewall 161b and the third lower sidewall 171a may include a curved surface. Each of the third middle lower sidewall 161b and the third lower sidewall 171a may have a concave shape. The third middle lower sidewall 161b may be formed to be concave toward the third middle gate line 161, and the third lower sidewall 171a may be formed to be concave toward the third lower gate line 171. A fourth gate isolation layer CT4 may be disposed between the third upper sidewall 151a and the third middle lower sidewall 161a. Each of the third middle lower sidewall 161b and the third lower sidewall 171a may be apart from the fourth gate isolation layer CT4. The third middle lower sidewall 161b may be covered by a third middle gate dielectric layer 165. The third lower sidewall 171a may be covered by a third lower gate dielectric layer 175. The third middle gate dielectric layer 165 may extend along a profile of the third middle lower sidewall 161b. The third lower gate dielectric layer 175 may extend along a profile of the third lower sidewall 171a. The fourth gate isolation layer CT4 may include a plurality of sidewalls which are convexly formed to contact the third middle gate dielectric layer 165 and the third lower gate dielectric layer 175. Accordingly, a width w4 of the fourth gate isolation layer CT4 in the second direction D2 may be widest at a center portion of the fourth gate isolation layer CT4.

Comparing FIG. 10 with FIG. 13, in example embodiments, the maximum width w4 of the fourth gate isolation layer CT4 in the second direction D2 may be less than the maximum width w2 of the second gate isolation layer CT2 in the second direction D2. Comparing FIG. 12 with FIG. 13, in example embodiments, the maximum width w3 of the third gate isolation layer CT3 in the second direction D2 may be less than the maximum width w4 of the fourth gate isolation layer CT4 in the second direction D2.

Figure 14:
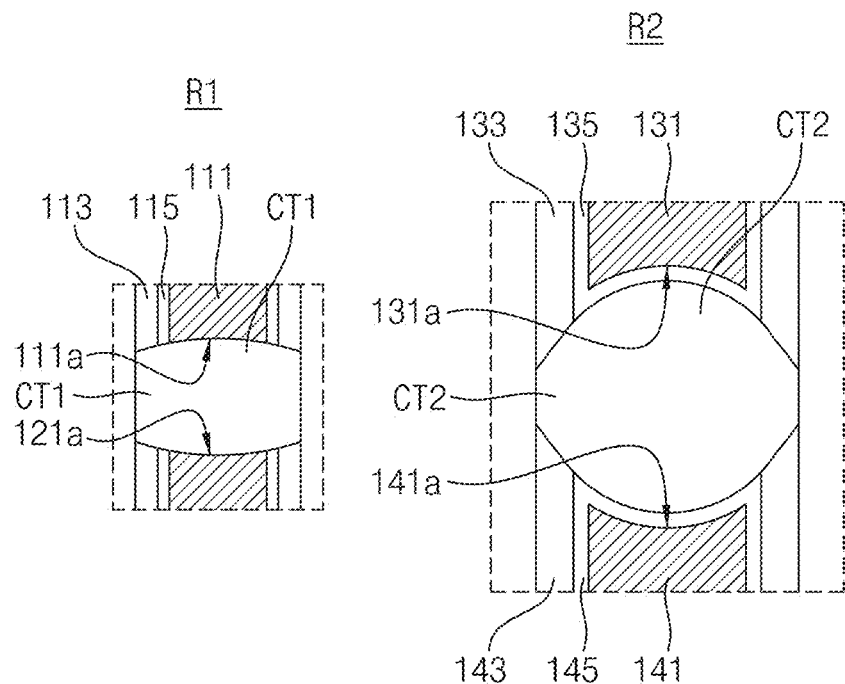
FIG. 14 illustrates enlarged views illustrating the enlargements of an R1 region of FIG. 3 and an R2 region of FIG. 4.

FIG. 14 illustrates enlarged views illustrating the enlargements of an R1 region of FIG. 3 and an R2 region of FIG. 4.

Referring to FIG. 14, in example embodiments, curvatures of a second upper sidewall 131a and a second lower sidewall 141a may differ from those of a first upper sidewall 111a and a first lower sidewall 121a. For example, the curvatures of the second upper sidewall 131a and the second lower sidewall 141a may be greater than those of the first upper sidewall 111a and the first lower sidewall 121a. Alternatively, the curvatures of the second upper sidewall 131a and the second lower sidewall 141a may be less than those of the first upper sidewall 111a and the first lower sidewall 121a.

Figure 15:
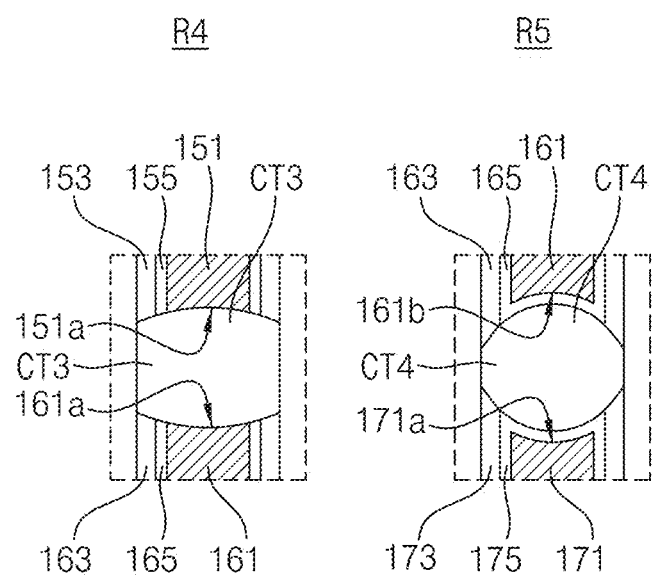
FIG. 15 illustrates enlarged views illustrating the enlargements of an R4 region and an R5 region of FIG. 5.

FIG. 15 illustrates enlarged views illustrating the enlargements of an R4 region and an R5 region of FIG. 5.

Referring to FIG. 15, in example embodiments, curvatures of a third upper sidewall 151a and a third middle upper sidewall 161a may differ from those of a third middle lower sidewall 161b and a third lower sidewall 171a. For example, the curvatures of the third upper sidewall 151a and the third middle upper sidewall 161a may be less than those of the third middle lower sidewall 161b and the third lower sidewall 171a. Alternatively, the curvatures of the third upper sidewall 151a and the third middle upper sidewall 161a may be greater than those of the third middle lower sidewall 161b and the third lower sidewall 171a.

Figure 16:
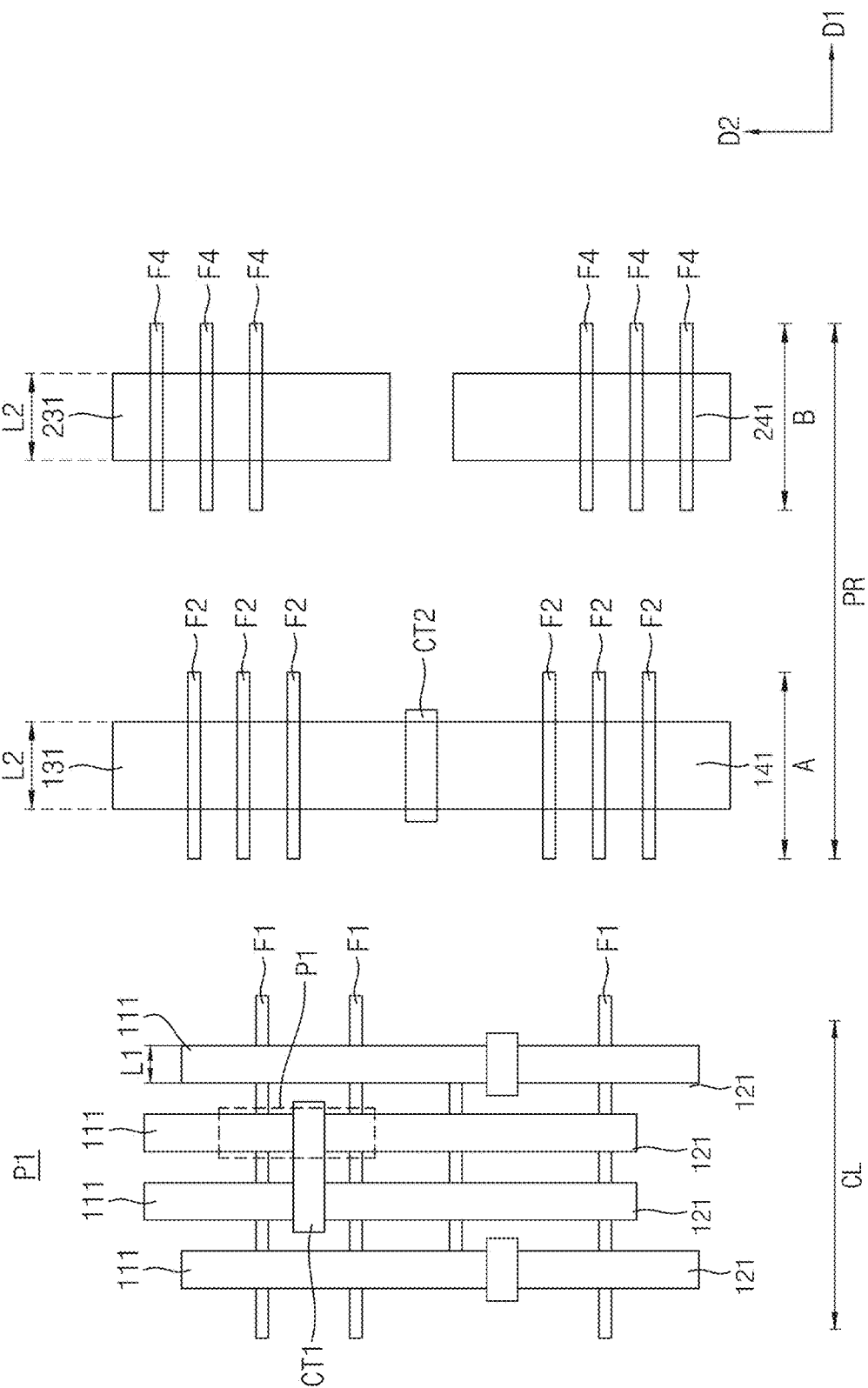
FIG. 16 is a plan layout illustrating main elements of an integrated circuit device according to example embodiments of the disclosure.
Figure 17:
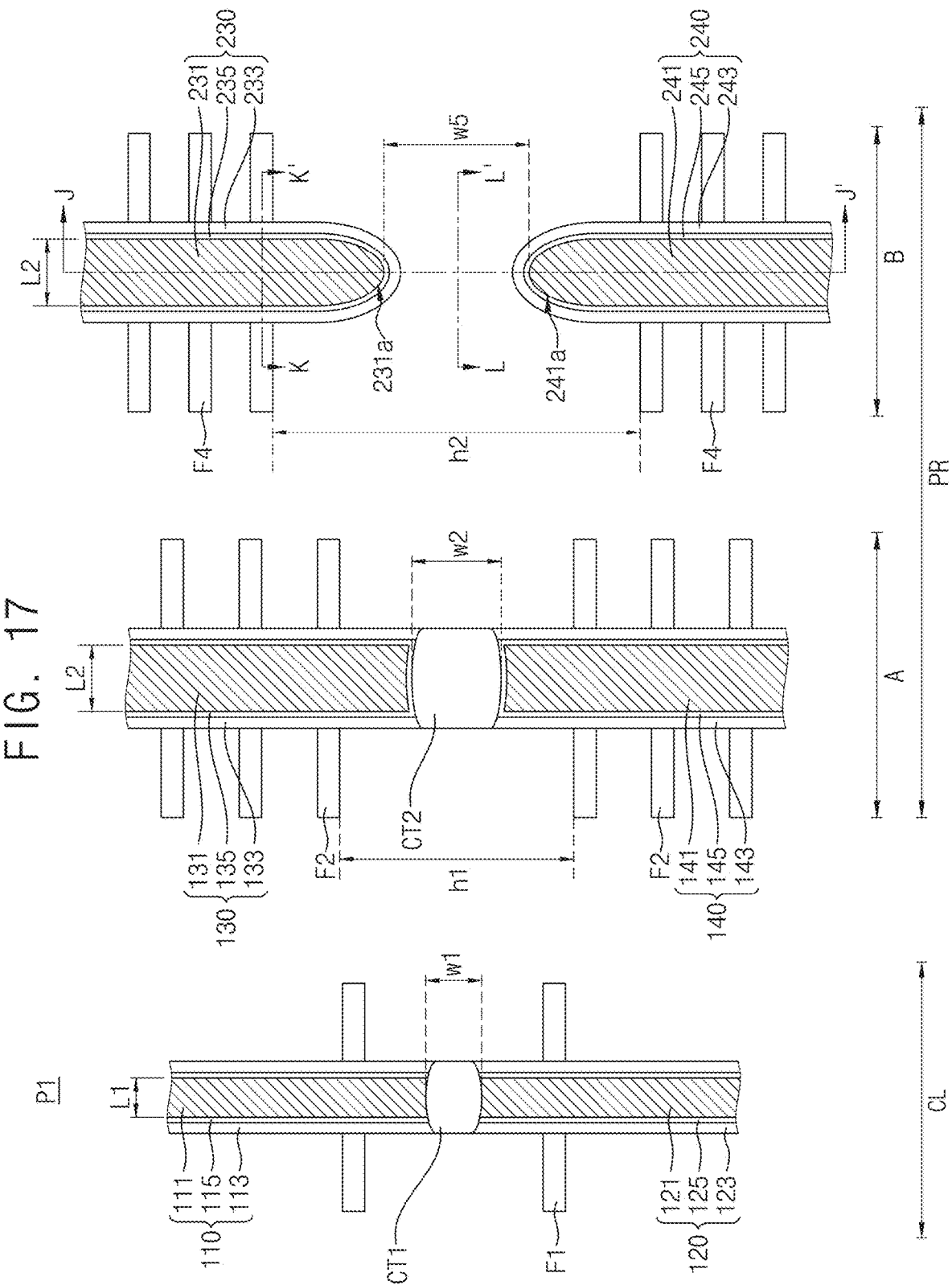
FIG. 17 illustrates plan views corresponding to FIG. 16.
Figure 18:
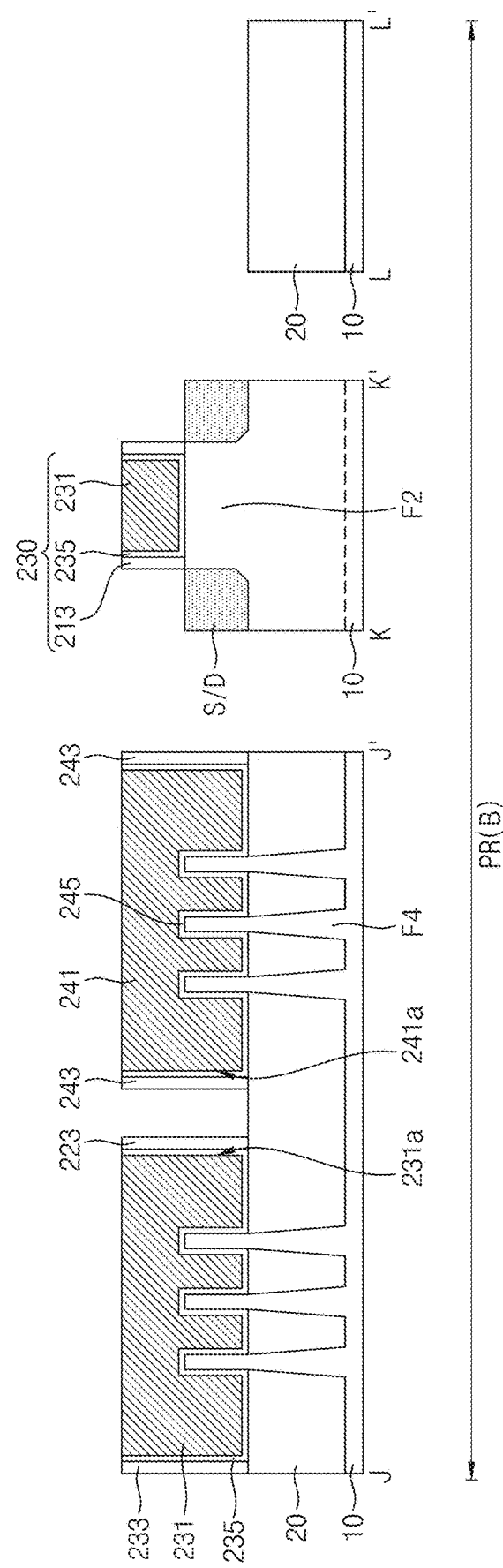
FIG. 18 illustrates cross-sectional views respectively taken along line J-J', line K-K', and line L-L' of FIG. 17.

FIG. 16 is a plan layout illustrating main elements of an integrated circuit device 200 according to example embodiments of the disclosure. FIG. 17 illustrates plan views corresponding to FIG. 16. FIG. 18 illustrates cross-sectional views respectively taken along line J-J', line K-K', and line L-L' of FIG. 17.

Referring to FIG. 16, the integrated circuit device 200 may include a cell area CL and a peri area PR. A plurality of gate lines having different widths may be disposed in the cell area CL and the pen area PR. A width L1 of each of gate lines 111 and 121 disposed in the cell area CL may be narrower than a width L2 of each of gate lines 131, 141, 231, and 241 disposed in the pen area PR. The cell area CL of FIG. 16 may include the same elements as those of the cell area CL of FIG. 1.

In example embodiments, the peri area PR may include an area A and an area B, which differ. The area A and the area B may include gate structures have different structures. The area A may include gate isolation layer and the area B may not include gate isolation layer. The area A and the area B may be adjacent areas, or may be areas apart from each other. The gate lines 131 and 141 disposed in the area A and the gate lines 231 and 241 disposed in the area B may have the same width L2. The area A of FIG. 16 may include the same elements as those of the P2 area of the first area S1 of FIG. 1.

Referring to FIGS. 16 to 18, in example embodiments, the integrated circuit device 200 may include a plurality of fourth active areas F4, a fourth upper gate structure 230, and/or a fourth lower gate structure 240, which are disposed in the area B of the peri area PR.

The plurality of fourth active areas F4 may extend in a first direction D1. The fourth upper gate structure 230 may intersect with the plurality of fourth active areas F4 and may extend in a second direction D2. The fourth lower gate structure 240 may intersect with the plurality of fourth active areas F4 and may extend in the second direction D2. The fourth upper gate structure 230 and the fourth lower gate structure 240 may be apart from each other in the second direction D2, on the same line.

In example embodiments, a shortest distance h2 between fourth active areas F4 intersecting with the fourth upper gate structure 230 and fourth active areas F4 intersecting with the fourth lower gate structure 240 may be greater than a shortest distance h1 between second active areas F2 intersecting with a second upper gate structure 130 and second active areas F2 intersecting with a second lower gate structure 140.

The fourth upper gate structure 230 may include a fourth upper gate line 231, a fourth upper gate spacer 233, and/or a fourth upper gate dielectric layer 235. The fourth lower gate structure 240 may include a fourth lower gate line 241, a fourth lower gate spacer 243, and/or a fourth lower gate dielectric layer 245.

The fourth upper gate line 231 may extend in the second direction D2, on an isolation layer 20 and may cover upper portions of the plurality of fourth active areas F4 protruding to above the isolation layer 20. The fourth lower gate line 241 may extend in the second direction D2, on an isolation layer 20 and may cover the upper portions of the plurality of fourth active areas F4 protruding to above the isolation layer 20. The fourth upper gate line 231 and the fourth lower gate line 241 may be apart from each other in the second direction D2, on the same line.

In example embodiments, the fourth upper gate line 231 may include an upper sidewall 231a which includes a curved surface, and the fourth lower gate line 241 may include a lower sidewall 241a which includes a curved surface. The upper sidewall 231a and the lower sidewall 241a may face each other. Each of the upper sidewall 231a and the lower sidewall 241a may have a convex shape. The upper sidewall 231a and the lower sidewall 241a may have a mirror symmetrical structure. In example embodiments, a shortest distance w5 between the upper sidewall 231a and the lower sidewall 241a may be greater than a maximum width w2 of a second gate isolation layer CT2 in the second direction D2.

The fourth upper gate spacer 233 may be disposed on a sidewall of the fourth upper gate line 231 and may long extend in a first direction D1 and the second direction D2. The fourth upper gate spacer 233 may be apart from the fourth upper gate line 231. The fourth lower gate spacer 243 may be disposed on a sidewall of the fourth lower gate line 241 and may long extend in the first direction D1 and the second direction D2. The fourth lower gate spacer 243 may be apart from the fourth lower gate line 241.

The fourth upper gate dielectric layer 235 may surround a bottom surface and both sidewalls of the fourth upper gate line 231 and may have a U-shape. A portion of the fourth upper gate dielectric layer 235 may extend along a top surface of the isolation layer 20 and profiles of the plurality of fourth active areas F4. A portion of the fourth upper gate dielectric layer 235 may be disposed between the fourth upper gate line 231 and the isolation layer 20 and between the fourth upper gate line 231 and the plurality of fourth active areas F4. A portion of the fourth upper gate dielectric layer 235 may be disposed between the fourth upper gate line 231 and the fourth upper gate spacer 233 and may extend in the first direction D1 and the second direction D2.

The fourth lower gate dielectric layer 245 may surround a bottom surface and both sidewalls of the fourth lower gate line 241 and may have a U-shape. A portion of the fourth lower gate dielectric layer 245 may extend along the top surface of the isolation layer 20 and the profiles of the plurality of fourth active areas F4. A portion of the fourth lower gate dielectric layer 245 may be disposed between the fourth lower gate line 241 and the isolation layer 20 and between the fourth lower gate line 241 and the plurality of fourth active areas F4. A portion of the fourth lower gate dielectric layer 245 may be disposed between the fourth lower gate line 241 and the fourth lower gate spacer 243 and may extend in the first direction D1 and the second direction D2.

An interlayer insulation layer (not shown) may be disposed between the fourth upper gate structure 230 and the fourth lower gate structure 240. The interlayer insulation layer may cover the isolation layer 20 and a source/drain S/D. A gate isolation layer, formed independently from the interlayer insulation layer, may not be provided between the fourth upper gate structure 230 and the fourth lower gate structure 240.

Figure 19:
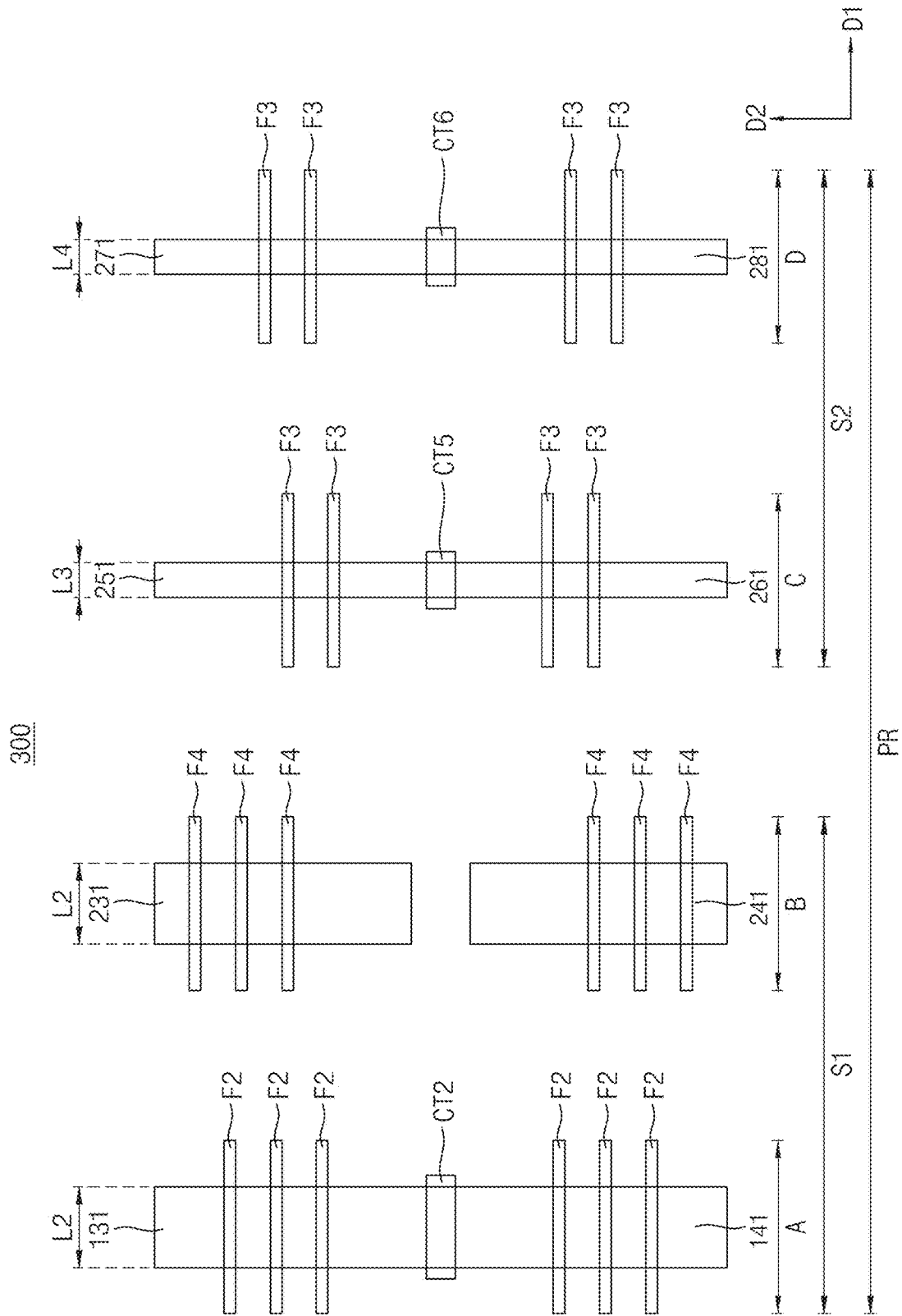
FIG. 19 is a plan layout illustrating main elements of an integrated circuit device according to example embodiments of the disclosure.
Figure 20:
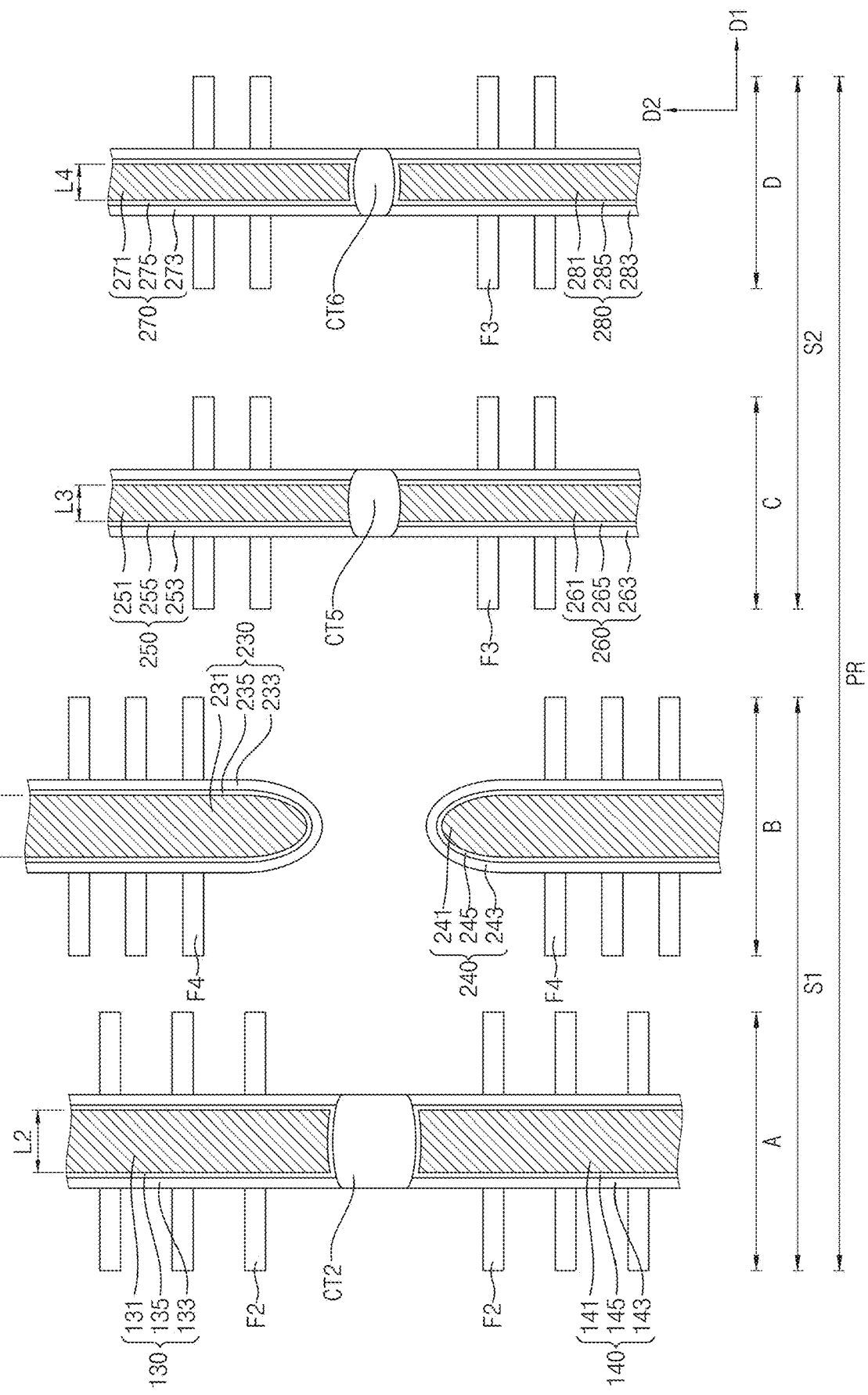
FIG. 20 illustrates plan views corresponding to FIG. 19.

FIG. 19 is a plan layout illustrating main elements of an integrated circuit device 300 according to example embodiments of the disclosure. FIG. 20 illustrates plan views corresponding to FIG. 19.

Referring to FIG. 19, the integrated circuit device 300 may include a first area S1 and a second area S2, which differ and are disposed in a peri area PR. A plurality of gate lines having different widths may be disposed in the first area S1 and the second area S2. A width L2 of each of gate lines 131, 141, 231, and 241 disposed in the first area S1 may be greater than a width L3 of each of gate lines 251 and 261 disposed in the second area S2 and a width L4 of each of gate lines 271 and 281 disposed in the second area S2. The first area S1 of the peri area PR of FIG. 19 may include the same elements as those of the peri area PR of FIG. 16.

Referring to FIGS. 19 and 20, in example embodiments, the integrated circuit device 300 may include at least one of an area C and an area D, which differ and are disposed in the second area S2 of the peri area PR. The area C and the area D may be adjacent areas, or may be areas apart from each other. The area C and the area D may include gate structures having different structures. A portion of the gate structure disposed in the area C includes a gate line in contact with the gate isolation layer. On the other hand, a portion of the gate structure disposed in the area D includes a gate line spaced apart from the gate isolation layer.

The integrated circuit device 300 may include a fifth upper gate structure 250, a fifth lower gate structure 260, and/or a fifth gate isolation layer CT5, which are disposed in the area C. The fifth gate isolation layer CT5 may be disposed between the fifth upper gate structure 250 and the fifth lower gate structure 260.

The fifth upper gate structure 250 may include a fifth upper gate line 251, a fifth upper gate spacer 253, and/or a fifth upper gate dielectric layer 255. The fifth lower gate structure 260 may include a fifth lower gate line 261, a fifth lower gate spacer 263, and/or a fifth lower gate dielectric layer 265. In example embodiments, the fifth gate isolation layer CT5 may contact the fifth upper gate line 251 and the fifth lower gate line 261.

The integrated circuit device 300 may include a sixth upper gate structure 270, a sixth lower gate structure 280, and/or a sixth gate isolation layer CT6, which are disposed in the area D. The sixth gate isolation layer CT6 may be disposed between the sixth upper gate structure 270 and the sixth lower gate structure 280.

The sixth upper gate structure 270 may include a sixth upper gate line 271, a sixth upper gate spacer 273, and/or a sixth upper gate dielectric layer 275. The sixth lower gate structure 280 may include a sixth lower gate line 281, a sixth lower gate spacer 283, and/or a sixth lower gate dielectric layer 285. In example embodiments, the sixth gate isolation layer CT6 may be apart from the sixth upper gate line 271 and the sixth lower gate line 281. The sixth upper gate dielectric layer 275 may be disposed between the sixth gate isolation layer CT6 and the sixth upper gate line 271. The sixth lower gate dielectric layer 285 may be disposed between the sixth gate isolation layer CT6 and the sixth lower gate line 281.

Figure 21:
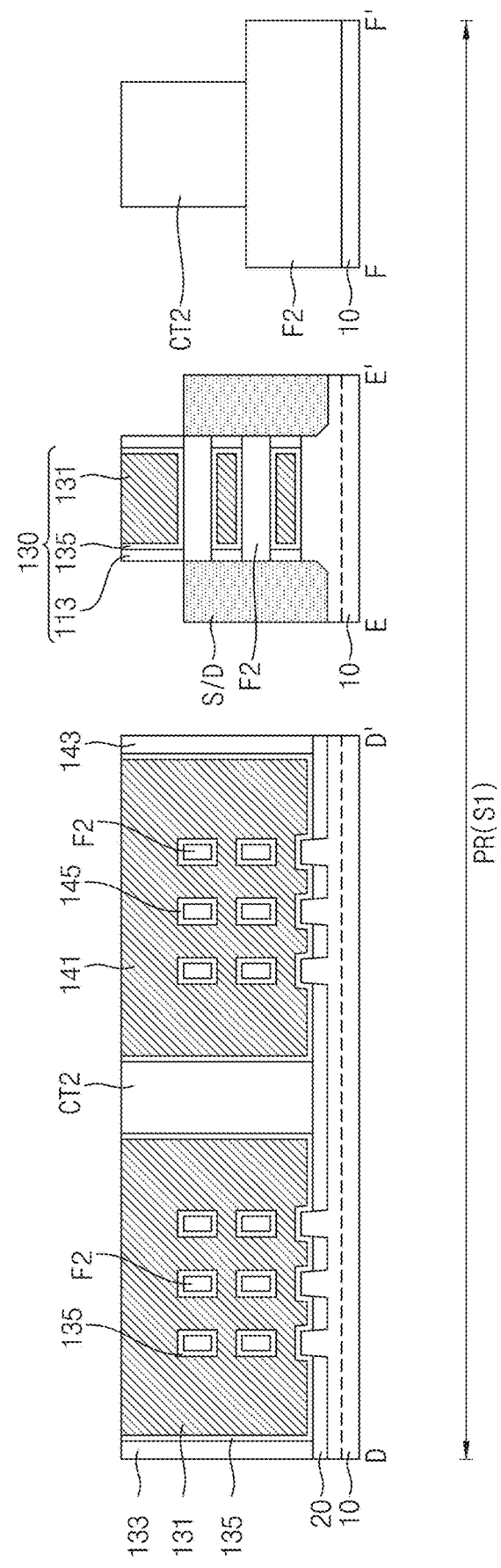
FIG. 21 is a cross-sectional view of line D-D' of FIG. 4 according to example embodiments.

FIG. 21 is a cross-sectional view of line D-D' of FIG. 4 according to example embodiments.

The descriptions given above with reference to FIGS. 1 to 20 may be identically applied to gate-all-around field-effect transistors (GAAFETs), multi-bridge channel field-effect transistors (MBCFETs), etc. In detail, referring to FIG. 21, an active area may include a plurality of channel patterns F2. The plurality of channel patterns F2 may extend in one direction and may be horizontally and vertically apart from one another. A plurality of gate dielectric layers 135 and 145 and a plurality of gate lines 131 and 141 may surround a plurality of channel patterns F2. As in FIG. 21, the active areas described above with reference to FIGS. 1 to 20 may each have a channel pattern and may all be surrounded by a plurality of gate dielectric layers and a plurality of gate lines.

According to example embodiments of the disclosure, an integrated circuit device where gate lines are isolated from one another by different methods in a cell area and a peri area may be provided. Furthermore, an integrated circuit device where a method of isolating gate lines is differently implemented in each peri area on the basis of a width of each of the gate lines. A gate line isolation method may be differently selected based on a process margin for each area, thereby decreasing a degradation, occurring near a gate line isolation area, in characteristic of an integrated circuit device.

Hereinabove, example embodiments of the disclosure have been described with reference to the accompanying drawings, but it may be understood that those skilled in the art may implement example embodiments in another detailed form without changing the inventive concepts or the essential feature. It should be understood that the example embodiments described above are merely examples in all aspects and are not limited.

What is claimed is:

1. An integrated circuit device comprising:
   an active area extending in a first direction on a substrate; and
   a gate line extending in a second direction intersecting with the first direction to intersect with the active area;
   a gate dielectric layer conformally on all vertical surfaces of the gate line;
   a gate spacer conformally on vertical surfaces of the gate dielectric layer which extend in the second direction; and
   a gate isolation layer including a face contacting the gate dielectric layer and the gate spacer, a width of the face of the gate isolation layer is equal to a width between outer faces of the gate spacer, the outer faces being opposite one another,
   wherein
   the gate line comprises a first sidewall and a second sidewall opposite to each other,
   the first sidewall has a convex shape, and
   the second sidewall has a concave shape.

2. The integrated circuit device of claim 1, wherein the first sidewall and the second sidewall have different curvatures.

3. The integrated circuit device of claim 1, wherein a curvature of the first sidewall is greater than a curvature of the second sidewall.

4. The integrated circuit device of claim 1, wherein the gate dielectric layer is between the second sidewall of the gate line and the gate isolation layer.

5. An integrated circuit device comprising:
   a plurality of first active areas extending in a first direction on a substrate;
   a plurality of second active areas extending in the first direction on the substrate;
   a first gate line extending in a second direction intersecting with the first direction to intersect with the plurality of first active areas, the first gate line having a first width;
   a second gate line extending in the second direction to intersect with the plurality of second active areas, the second gate line having a second width which is narrower than the first width;

a third gate line extending in the second direction apart from the second gate line in the second direction, the third gate line having the second width;

a first gate dielectric layer conformally on all vertical surfaces of the first gate line;

a first gate spacer conformally on vertical surfaces of the first gate dielectric layer which extend in the second direction; and a first gate isolation layer between the second gate line and the third gate line, the first gate isolation layer including a face contacting the first gate dielectric layer and the first gate spacer, a width of the face of the gate isolation layer is equal to a width between outer faces of the first gate spacer, the outer faces being opposite one another, wherein the first gate line comprises a curved surface and comprises a first sidewall and a second sidewall having different curvatures, and the first gate isolation layer contacts the second gate line and the third gate line.

6. The integrated circuit device of claim 5, wherein the first sidewall has a convex shape.

7. The integrated circuit device of claim 5, wherein the second sidewall has a concave shape.

8. The integrated circuit device of claim 5, further comprising:

a fourth gate line apart from the third gate line in the second direction, the fourth gate line having the second width; and a second gate isolation layer between the third gate line and the fourth gate line, wherein the third gate line is between the second gate line and the fourth gate line in the second direction, and the second gate isolation layer is apart from the third gate line and the fourth gate line.

9. The integrated circuit device of claim 8, further comprising:

a fifth gate line apart from the first gate line in the second direction, the fifth gate line having the first width; and a third gate isolation layer between the first gate line and the fifth gate line, wherein the third gate isolation layer is apart from the first gate line and the fifth gate line.

10. The integrated circuit device of claim 8, further comprising a fifth gate line apart from the first gate line in the second direction, the fifth gate line having the first width, wherein the fifth gate line comprises a convex sidewall facing the first sidewall.

11. An integrated circuit device comprising:

a substrate including a cell area, where a static random access memory (SRAM) cell is located, and a peri area where a peripheral circuit configured to operate the SRAM cell is located;

a first upper gate line extending in one direction in the cell area;

a first upper gate dielectric layer conformally on all vertical surfaces of the first upper gate line;

a first upper gate spacer conformally on vertical surfaces of the first upper gate dielectric layer;

a first lower gate line extending in the one direction in the cell area apart from the first upper gate line in the one direction;

a first gate isolation layer between the first upper gate line and the first lower gate line, the first gate isolation layer including a face contacting the first upper gate dielectric layer and the upper first gate spacer, a width of the face of the first gate isolation layer is equal to a width between outer faces of the first upper gate spacer, the outer faces being opposite one another;

a second upper gate line extending in one direction in the peri area;

a second lower gate line extending in the one direction in the peri area apart from the second upper gate line in the one direction; and a second gate isolation layer between the second upper gate line and the second lower gate line, wherein the first gate isolation layer contacts the first upper gate line and the first lower gate line, the second gate isolation layer is apart from the second upper gate line and the second lower gate line, and each of the second upper gate line and the second lower gate line comprises a concave sidewall.

12. The integrated circuit device of claim 11, wherein at least one of the second upper gate line and the second lower gate line further comprises a convex sidewall.

13. The integrated circuit device of claim 11, wherein a width of each of the first upper gate line and the first lower gate line is less than a width of each of the second upper gate line and the second lower gate line.

14. The integrated circuit device of claim 13, further comprising:

a third upper gate line extending in the one direction in the peri area;

a third lower gate line extending in the one direction in the peri area apart from the third upper gate line in the one direction; and a third gate isolation layer between the third upper gate line and the third lower gate line, wherein the third gate isolation layer contacts the third upper gate line and the third lower gate line.

15. The integrated circuit device of claim 14, wherein a width of each of the third upper gate line and the third lower gate line is less than a width of each of the second upper gate line and the second lower gate line.

16. The integrated circuit device of claim 15, further comprising:

a fourth upper gate line extending in the one direction in the peri area;

a fourth lower gate line extending in the one direction in the peri area apart from the fourth upper gate line in the one direction; and a fourth gate isolation layer between the fourth upper gate line and the fourth lower gate line, wherein the fourth gate isolation layer is apart from the fourth upper gate line and the fourth lower gate line.

17. The integrated circuit device of claim 16, wherein a width of each of the fourth upper gate line and the fourth lower gate line is less than a width of each of the second upper gate line and the second lower gate line.

18. The integrated circuit device of claim 13, further comprising:

a third upper gate line extending in the one direction in the peri area;

a third lower gate line extending in the one direction in the peri area apart from the third upper gate line in the one direction; and a third gate isolation layer between the third upper gate line and the third lower gate line, wherein the third gate isolation layer is apart from the third upper gate line and the third lower gate line.

19. The integrated circuit device of claim 18, wherein a width of each of the third upper gate line and the third lower gate line is less than a width of each of the second upper gate line and the second lower gate line.

\* \* \* \* \*